United States Patent
Zhou et al.

(10) Patent No.: US 10,495,387 B2
(45) Date of Patent: Dec. 3, 2019

(54) MULTI-LAYER WICK STRUCTURES WITH SURFACE ENHANCEMENT AND FABRICATION METHODS

(71) Applicant: Toyota Motor Engineering & Manufacturing North America, Inc., Erlanger, KY (US)

(72) Inventors: Feng Zhou, South Lyon, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 136 days.

(21) Appl. No.: 15/722,589

(22) Filed: Oct. 2, 2017

(65) Prior Publication Data
US 2018/0259268 A1    Sep. 13, 2018

Related U.S. Application Data

(60) Provisional application No. 62/469,784, filed on Mar. 10, 2017.

(51) Int. Cl.
| | |
|---|---|
| *F28D 15/04* | (2006.01) |
| *B23P 15/26* | (2006.01) |
| *B22F 3/11* | (2006.01) |
| *B22F 7/02* | (2006.01) |
| *B22F 5/00* | (2006.01) |

(Continued)

(52) U.S. Cl.
CPC .............. *F28D 15/046* (2013.01); *B22F 3/11* (2013.01); *B23P 15/26* (2013.01); *F28F 13/003* (2013.01); *F28F 21/08* (2013.01); *H01L 23/427* (2013.01); *B22F 5/00* (2013.01); *B22F 7/02* (2013.01);

(Continued)

(58) Field of Classification Search
CPC ...... B23P 2700/09; B23P 15/26; B21D 53/02; F28F 2255/18; F28D 15/046; B22F 3/11; B22F 3/004; B22F 3/1118; B22F 3/12; B22F 3/14; B22F 5/00; B22F 7/02
See application file for complete search history.

(56) References Cited

U.S. PATENT DOCUMENTS

| | | |
|---|---|---|
| 8,720,530 B2 | 5/2014 | Asfia et al. |
| 9,455,177 B1 | 9/2016 | Park et al. |

(Continued)

*Primary Examiner* — Christopher J Besler
(74) *Attorney, Agent, or Firm* — Dinsmore & Shohl LLP

(57) ABSTRACT

A method for fabricating a multi-layer porous wick structure including, providing a first mold set comprising a negative mold and a positive mold, introducing metal particles in the negative mold defining a first porous wick layer, and sintering the metal particles within the negative mold while interfaced with the positive mold to form the first porous wick layer. The method further includes providing a second mold set comprising a negative mold and a positive mold corresponding to the negative mold and assembling the first porous wick layer with the negative mold of the second mold set. The method further includes introducing filler particles into the negative mold of the second mold set to form a sacrificial layer with the first porous wick layer, introducing metal particles in the negative mold of the second mold set with the first porous wick layer and the sacrificial layer and sintering the metal particles, thereby forming the multi-layer porous wick structure.

15 Claims, 27 Drawing Sheets

(51) Int. Cl.
  *H01L 23/427* (2006.01)
  *F28F 13/00* (2006.01)
  *F28F 21/08* (2006.01)
  *F28D 15/02* (2006.01)

(52) U.S. Cl.
  CPC ...... *B23P 2700/09* (2013.01); *F28D 15/0233* (2013.01); *F28F 2255/18* (2013.01)

(56) References Cited

U.S. PATENT DOCUMENTS

| | | |
|---|---|---|
| 2010/0307003 A1 | 12/2010 | Hoffman et al. |
| 2011/0240264 A1 | 10/2011 | Wang et al. |
| 2015/0159511 A1* | 6/2015 | Burns ................ B22F 3/22 428/76 |

* cited by examiner

MULTI-LAYER WICK STRUCTURES WITH SURFACE ENHANCEMENT AND FABRICATION METHODS

CROSS REFERENCE TO RELATED APPLICATIONS

This application claims priority from U.S. Patent Application No. 62/469,784 filed Mar. 10, 2017, the entire disclosure of which is incorporated herein by reference.

TECHNICAL FIELD

The present specification generally relates to apparatuses and methods of fabricating apparatuses for cooling heat generating devices such as power electronic devices and, more specifically, to multi-layer porous wick structures with surface enhancement features and methods of fabricating multi-layer porous wick structures with surface enhancement features for improved heat dissipation performance of the multi-layer wick structure.

BACKGROUND

Heat sinking devices may be coupled to a heat-generating device, such as a power electronics device, to remove heat and lower the maximum operating temperature of the heat-generating device. Cooling fluid may be used to receive heat generated by the heat-generating device by convective thermal transfer and remove such heat from the heat-generating device. For example, a jet of cooling fluid may be directed such that it impinges a surface of the heat-generating device. Another method may include removing heat from a heat-generating device by passing cooling fluid between and around a finned heat sink made of thermally conductive material, such as aluminum.

However, as power electronic devices are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Additionally, while active liquid cooling architectures, such as single and two-phase jet impingement or microchannel heat sinks can alleviate these thermal demands, these systems require dedicated auxiliary components, for example, compressors/pumps, fluid connects, filters, etc., which may be weak points for overall system reliability.

Vapor chambers may offer a viable solution to dissipating localized hotspots while maintaining an acceptable level of reliability. Vapor chambers may transfer heat from hotspots to porous wick structures having cooling fluid that boils within a sealed vapor chamber. The vapor rises away from the localized hotspot extracting heat with the vapor and condensing over an adjacent porous surface, which through capillary action within interconnected porous structures of the vapor chamber cooling fluid is transferred back to hotspots for further heat extraction through boiling. However, current methods of fabricating the porous wick structures face challenges that affect the wicking process and decrease wick performance, such as subtractive processes, which lead to fused particles in critical regions of the porous wick layers reducing their overall performance. Additionally, interconnected structures for returning cooling fluid to hotspots reduce the area available for boiling of the cooling fluid thus reducing cooling performance.

Accordingly, a need exists for multi-layer wick structures with surface enhancement features and improved methods of fabricating multi-layer porous wick structures with surface enhancement features for improved heat dissipation performance by the multi-layer porous wick structure.

SUMMARY

In one embodiment, a method for fabricating a multi-layer porous wick structure may include providing a first mold set including a negative mold and a positive mold, introducing metal particles in a cavity of the negative mold defining a first porous wick layer, and sintering the metal particles at a first sintering temperature for a first sintering time within the negative mold while interfaced with the positive mold to form the first porous wick layer, where the first porous wick layer includes a first surface opposite a second surface and a plurality of porous liquid supply posts extend from the first surface away from the second surface. The method may further include providing a second mold set including a negative mold and a positive mold corresponding to the negative mold, where the negative mold includes a cavity defined by one or more sidewalls enclosing a base surface offset from a negative mold top surface and the cavity is contoured for receiving the first porous wick layer and assembling the first porous wick layer with the negative mold of the second mold set. The method may further include introducing filler particles into the negative mold of the second mold set, where the filler particles form a sacrificial layer with the first surface and plurality of porous liquid supply posts of the first porous wick layer such that a portion of the plurality of porous liquid supply posts remain free of the sacrificial layer, introducing metal particles in the negative mold of the second mold set with the first porous wick layer and the sacrificial layer, and sintering the metal particles at a second sintering temperature for a second sintering time thereby forming the multi-layer porous wick structure including the first porous wick layer including a plurality of porous liquid supply posts coupled to a second porous wick layer.

In another embodiment, the method for fabricating a multi-layer porous wick structure may include providing a first mold set including a negative mold and a positive mold, introducing metal particles in a cavity of the negative mold defining a first porous wick layer and sintering the metal particles within the negative mold while interfaced with the positive mold to form the first porous wick layer, where the first porous wick layer includes a first surface opposite a second surface, a plurality of porous liquid supply posts extending from the first surface away from the second surface, and a plurality of through-holes extending between the first surface and the second surface of the first porous wick layer. The method may further include providing a second mold set including a negative mold and a positive mold corresponding to the negative mold, where the negative mold includes a cavity defined by one or more sidewalls enclosing a base surface offset from a negative mold top surface and the cavity is contoured for receiving the first porous wick layer and receiving the first porous wick layer in the negative mold of the second mold set. The method may further include introducing filler particles into the negative mold of the second mold set, where the filler particles form a sacrificial layer with the first surface and plurality of porous liquid supply posts of the first porous wick layer such that a portion of the plurality of porous liquid supply posts remain free of the sacrificial layer, introducing metal particles in the negative mold of the second mold set with the first porous wick layer and the sacrificial layer, applying a sintering pressure to the metal particles with the positive mold of the second mold set, and sintering the metal particles at a sintering temperature for a sintering time, thereby forming a second porous wick layer coupled to the plurality of porous liquid supply posts of the first porous wick layer.

In yet another embodiment, the method for fabricating a multi-layer porous wick structure may include providing a first mold set including a negative mold and a positive mold, introducing metal particles in a cavity of the negative mold of the first mold set, and sintering the metal particles in the first mold set to form a first porous wick layer including a plurality of porous liquid supply posts extending from the first porous wick layer and a plurality of surface enhancement features formed with the first porous wick layer. The method may further include providing a second mold set including a negative mold and a positive mold corresponding to the negative mold, where the negative mold includes a cavity contoured for receiving the first porous wick layer and assembling the negative mold of the second mold set with the first porous wick layer with the negative mold of the second mold set. The method may further include introducing filler particles into the negative mold of the second mold set, where the filler particles form a sacrificial layer over the first porous wick layer and the sacrificial layer extends no more than the height of the plurality of porous liquid supply posts and compacting the filler particles with a forming mold including cavities for receiving the filler particles to fabricate a sacrificial layer that extends above the plurality of porous liquid supply posts in defined sections while maintaining exposure to at least a portion of the plurality of porous liquid supply posts. The method may further include introducing metal particles in the negative mold of the second mold set having the first porous wick layer and the sacrificial layer and sintering the metal particles thereby forming a second porous wick layer coupled to the plurality of porous liquid supply posts of the first porous wick layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
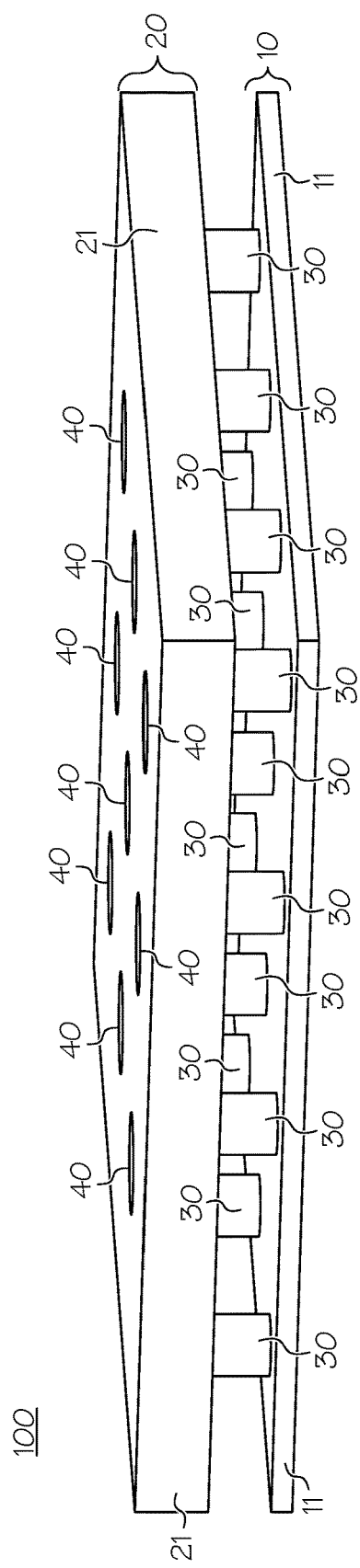
FIG. 1 schematically depicts a perspective view of an example multi-layer wick structure according to one or more embodiments shown and described herein.

FIG. 1 generally depicts an example multi-layer porous wick structure 100 for implementation in a vapor chamber device suitable for extracting heat, for example, from power electronic packages. The multi-layer porous wick structure 100 depicted in FIG. 1 is a two-layer porous wick structure having a first porous wick layer 10 defining a base wick layer 10 coupled to a second porous wick layer 20 defining a cap wick layer 20 through a plurality of porous liquid supply posts 30 forming interstitial spaces around the plurality of porous liquid supply posts 30 and between the base wick layer 10 and cap wick layer 20. The plurality of porous liquid supply posts 30 may have different cross-sections, such as, without limitation, circular, triangular, square, or other closed shape cross-sections. The plurality of porous liquid supply posts 30 may also have non-uniform cross-sections along their length, for example, the plurality of porous liquid supply posts 30 may be tapered. A porous wick layer with tapered porous liquid supply posts may allow for easier removal from the mold after sintering. The multi-layer porous wick structure 100 also includes a plurality of through-holes 40 defining vapor vents 40 in the cap wick layer 20. The multi-layer porous wick structure 100 may also include a liquid supply wick (not shown) coupled to sidewalls 11 of the base wick layer 10 and the sidewalls 21 of the cap wick layer 20. Additionally, the multi-layer porous wick structure 100 may include additional layers (not shown), for example, a third porous wick layer defining a condensing layer coupled to the second porous wick layer 20 defining the cap wick layer 20 through additional porous liquid supply posts 30 forming interstitial spaces around the plurality of porous liquid supply posts 30 and between the condensing layer and cap wick layer 20 thereby defining a vapor core.

The multi-layer porous wick structure 100 may further be enclosed in a vapor chamber and include cooling fluid. An appropriate cooling fluid may be determined based on the operating temperature ranges to effect cooling through the vapor chamber. As a non-limiting example, the cooling fluid may be water. The thermophysical properties of water, for example, may be ideal for operating temperatures from about 0 degrees Celsius to about 200 degrees Celsius. While water is used in the following example it is conceivable that other cooling fluids may be used other than water.

As a non-limiting example, during use, the heat generated by a device coupled to a vapor chamber conducts through the vapor chamber evaporator wall into the base wick layer 10 containing cooling fluid in the porous structure of the base wick layer 10. The cooling fluid begins to boil and evaporate from the base wick layer 10 as the temperature increases. The vapor from the boiling cooling fluid rises from the base wick layer 10 into the interstitial spaces around the plurality of porous liquid supply posts 30 and between the base wick layer 10 and the cap wick layer 20. The vapor further travels through the plurality of through-holes 40 defining vapor vents 40 in the cap wick layer 20. As the vapor travels from the interstitial spaces through the vapor vents 40 the vapor begins to condense. Some vapor may condense on and into the porous structure of the cap wick layer 20. Through capillary action, the condensed cooling fluid is transported through the cap wick layer 20 and the plurality of porous liquid supply posts 30 back into the base wick layer 10. The capillary action may be sufficient to feed hotspots of the base wick layer 10 with cooling fluid to continue to promote boiling and evaporation at the hotspots of the base wick layer 10 and prevent dry out of the base wick layer 10.

Vapor that does not condense with the cap wick layer 20 may travel through the vapor vents 40 to an additional cap wick layer 20 or a condensing layer where the vapor condenses and capillary action returns the condensed cooling fluid to the base wick layer 10 through the plurality of porous liquid supply posts 30. The condensing layer may be a metal plate or porous wick layer or a combination thereof and optionally formed through methods described herein. A porous side wick on the walls (not shown) or liquid supply wick (not shown) of the vapor chamber may couple and promote capillary transport of the cooling fluid between the condensing layer, cap wick layer and base wick layer. Additionally, a plurality of porous liquid supply posts may couple a condensing layer to a cap wick layer as well as a cap wick layer to a base wick layer. However, the plurality of porous liquid supply posts may be optimized between the condensing layer and cap wick layer, for example, such that fewer porous liquid supply posts are positioned between the condensing layer and the cap wick layer than the cap wick layer and the base wick layer. This optimization will prevent excess heat conduction through the plurality of porous liquid supply posts and cap wick layer to the condensing layer. In addition to the plurality of porous liquid supply posts 30, a liquid supply wick (not shown) may feed the base wick layer 10 with cooling fluid. In some embodiments, cooling fluid is introduced to the liquid supply wick during assembly of the vapor chamber. In other embodiments, the liquid supply wick may receive cooling fluid from a reservoir of cooling fluid or cap wick layers 20 coupled to the liquid supply wick.

Figure 2A:
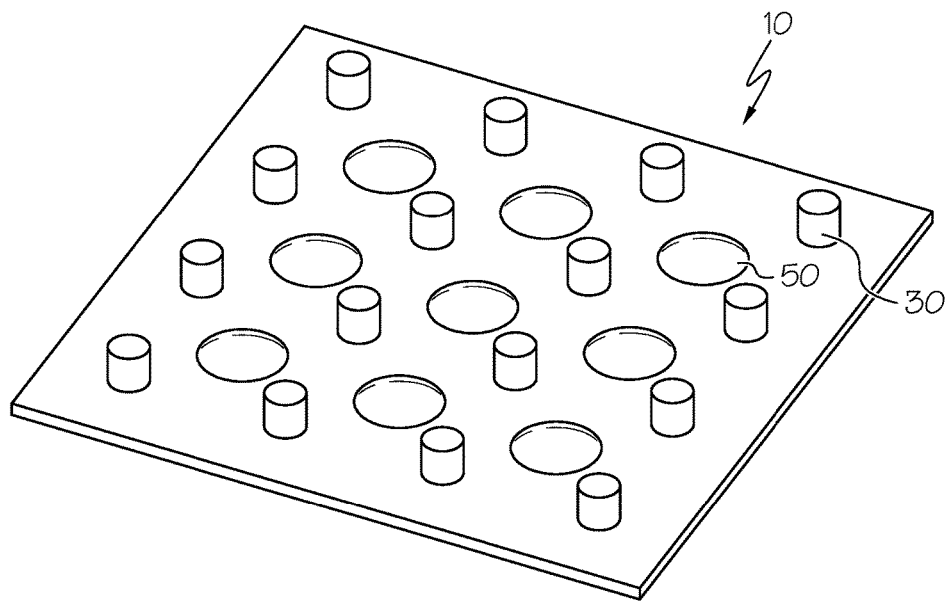
FIGS. 2A & 2B schematically depict a perspective view and side view of an example base layer of a multi-layer wick structure having surface enhancement features according to one or more embodiments shown and described herein.
Figure 2B:
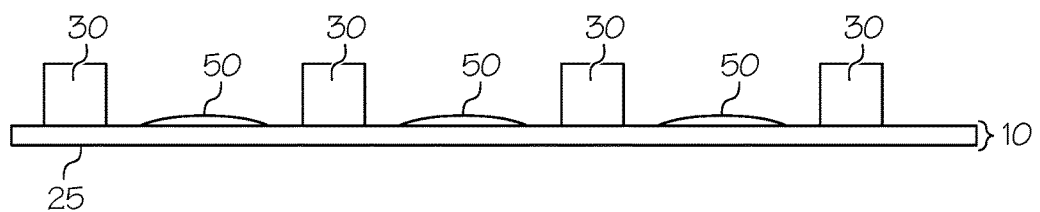

In some embodiments, it may be advantageous to include surface enhancement features 50 within the multi-layer porous wick structure 100. As a non-limiting example, a base wick layer 10 may include surface enhancement features 50 to improve the boiling and evaporating process of the cooling fluid at hotspots. FIGS. 2A and 2B depict surface enhancement features 50 as elements of the base wick layer 10. Additionally, FIG. 2C generally depicts several cross-sectional examples of surface enhancement features 50. For the purpose of the base wick layer 10, surface enhancement features 50 may operate to increase the surface area available to promote boiling and evaporation. The additional surface area may offset surface area lost to the presence of the plurality of porous liquid supply posts 30 or increase the surface area in hotspot locations to promote improved heat transfer. In other embodiments, surface enhancement features 50 may be included in the cap wick layer 20 or additional layers to increase the surface area available for condensing vapor to liquid cooling fluid.

Figure 2C:
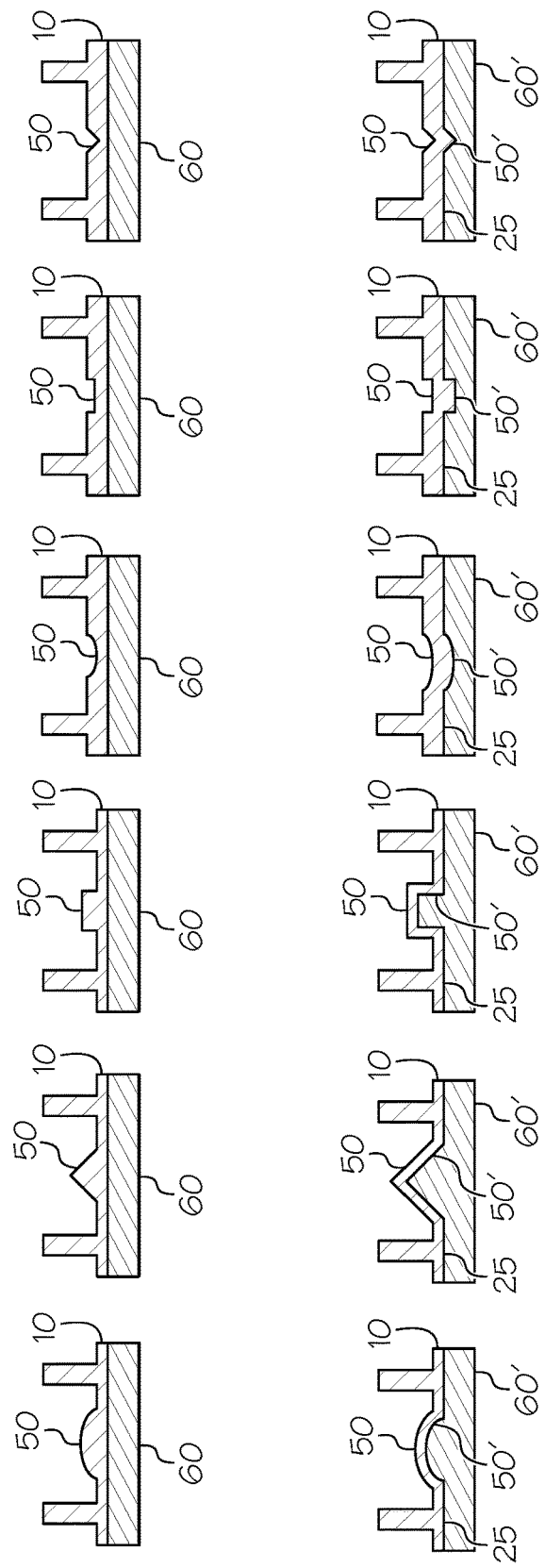
FIG. 2C schematically depicts multiple cross-sections of example surface enhancement features for a multi-layer wick structure according to one or more embodiments shown and described herein.

Referring to FIGS. 2A and 2B, the surface enhancement features 50 depicted are dome shaped protrusions from the base wick layer 10 disposed between and around the plurality of porous liquid supply posts 30. The surface enhancement features 50 may be disposed uniformly across a base wick layer 10 or positioned to correspond to localized hotspots of the base wick layer 10 during operation with a heat-generating device. Additionally, the surface enhancement features 50 may vary in size and shape across the base wick layer 10. FIG. 2C depicts some cross-sectional non-limiting examples of surface enhancement features 50. In some embodiments, the surface enhancement features 50 may be protrusions from the base wick layer 10 where the surface 25 of the base wick layer 10 opposing the surface enhancement features 50 is generally planar and does not include surface enhancement features 50 thereby capable of coupling with a substrate 60, for example, without limitation, a metal plate which is optionally a copper plate. However, in other embodiments, it may be advantageous for the surface 25 of the base wick layer 10 opposing the surface enhancement feature 50 to include a corresponding inverse surface enhancement feature 50'. Subsequently, the inverse surface enhancement feature 50' may couple with a substrate 60', for example, without limitation, a metal plate, which is optionally, a copper plate including the surface enhancement feature 50.

The multi-layer porous wick structure 100 and corresponding vaper chamber components may be formed of various materials. In some embodiments, the multi-layer porous wick structure 100 is formed from a thermally conductive metal or alloy, such as, without limitation, copper. In further embodiments, the material forming the multi-layer wick structure is hydrophilic, e.g., where the cooling fluid is water, and is a conductive material. A non-limiting example is sintered copper powder or copper particles that comprise superhydrophilic nanostructures. As used herein, the wetting with a liquid of a surface of a material will be described in relation to a contact angle at which the liquid-vapor interface meets the solid-liquid interface. A wettable surface, for example, hydrophilic if water is the cooling fluid, is any surface with a contact angle of less than 90 degrees, i.e., low contact angle, which indicates that wetting of the surface is very favorable, and a liquid will likely spread over the surface and in the case of a porous material, may spread into the material. A nonwettable surface, for example, hydrophobic if water is the cooling fluid is any surface with a contact angle of greater than 90 degrees, i.e., high contact angle, which indicates that wetting of the surface is unfavorable, so a liquid will likely minimize contact with the surface and form a compact liquid droplet on the surface. A superhydrophilic surface, for example, if water is the cooling fluid, refers to a surface on which a liquid will uniformly spread such that it forms a thin conformal liquid layer rather than a droplet with a measurable contact angle. Therefore, the above-mentioned superhydrophilic nanostructures are structures that either have superhydrophilic surfaces, or in combination form a superhydrophilic surface. For purposes of the description herein, the term "metal particles" refers various materials that may be used in place of or in combination with metal particles, for example, copper particles. Additionally, the term "particles" may refer to particles and or powders.

Various fabrication methods for fabricating multi-layer porous wick structures 100 will now be described in more detail herein. The following fabrication methods refer to the multi-layer porous wick structure 100 similar to the structure shown and described in FIG. 1. However, multi-layer porous wick structures 100 having different shapes, sizes and layouts are within the scope of the fabrication methods described herein. For example, without limitation, other multi-layer porous wick structures 100 may include more than two layers or various layouts, sizes and shapes defining the porous liquid supply posts 30 and vapor vents 40 or a variety of surface enhancement features 50 formed with the layers of the multi-layer porous wick structure 100.

Figure 3:
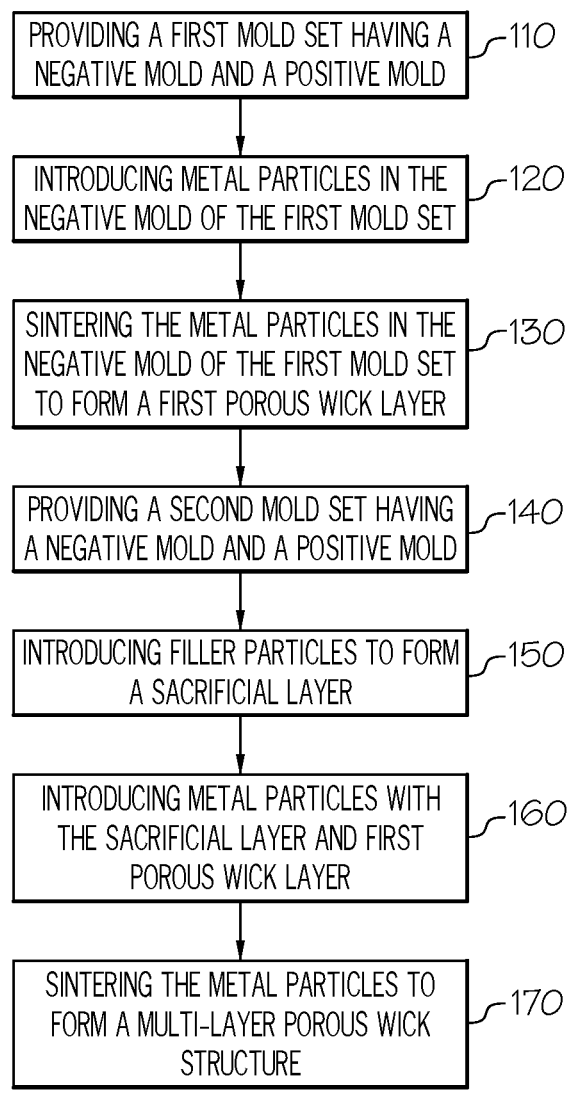
FIG. 3 is a flowchart depicting a method of fabricating a multi-layer porous wick structure according to one or more embodiments shown and described herein.

Referring to FIG. 3 flowchart of a method for fabricating a multi-layer porous wick structure 100 is depicted. Methods for fabricating a multi-layer porous wick structure 100 described herein generally include step 110 of providing a first mold set comprising a negative mold and a positive mold, step 120, introducing metal particles into the negative mold of the first mold set, and step 130, sintering the metal particles in the negative mold of the first mold set where pressure is applied to the metal particles with the positive mold of the first mold set thereby forming a first porous wick structure having a plurality of porous liquid supply posts 30. The method further generally includes step 140 of providing a second mold set comprising a positive mold and a negative mold configured to receive the first porous wick structure, step 150, introducing filler particles to form a sacrificial layer with the first porous wick layer in the negative mold of the second mold set, step 160, introducing metal particles with the sacrificial layer and the first wick layer in the negative mold of the second mold set and step 170, sintering the metal particles in the negative mold of the second mold set where pressure is applied to the metal particles by the positive mold of the second mold set. The sintering of the metal particles in the negative mold of the second mold set, in step 170, forms a second porous wick layer coupled to the porous liquid supply posts 30 of the first porous wick layer. The aforementioned general fabrication method may be further defined to accommodate variations in order by which a multi-layer porous wick structure 100 is fabricated, for example, a multi-layer porous wick structure 100 using the methods described herein may be formed from a base wick layer 10 to a cap wick layer 20 or a cap wick layer 20 to a base wick layer 10. Furthermore, while the steps previously described are presented in a particular order, it is within the scope of the fabrication methods described herein that steps may be carried out in a variety of orders and may include additional intervening steps. For example, without limitation, fabrication methods may include molds for forming vapor vents 40 in the cap wick layer 20 or liquid supply wicks coupling the base wick layer 10 and the cap wick layer 20 or surface enhancement features 50. The fabrication methods described herein may also include or be integrated with methods of fabricating a multi-layer porous wick structure 100 with a vapor chamber. The first method of fabricating a multi-layer porous wick structure 100 described below relates to forming the multi-layer porous wick structure 100 from a cap wick layer 20 to a base wick layer 10. The second method of fabricating a multi-layer porous wick structure 100 described below relates to forming the multi-layer porous wick structure 100 from a base wick layer 10 to a cap wick layer 20.

Figure 4:
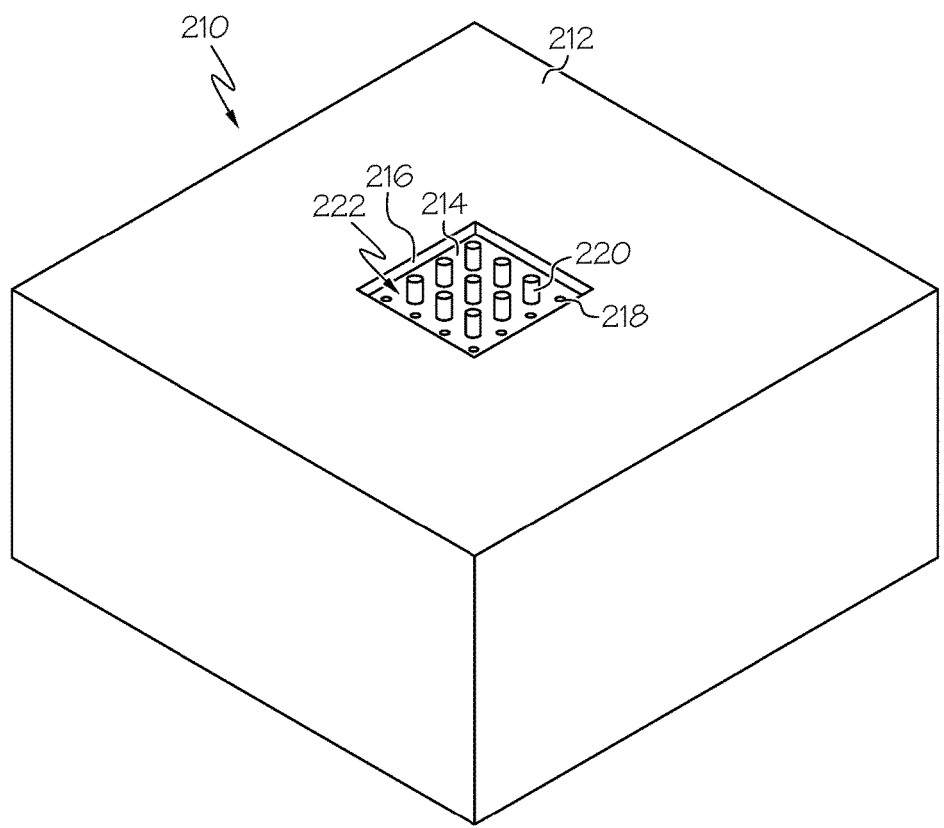
FIG. 4 schematically depicts a perspective view of an example negative mold of a first mold set according to one or more embodiments shown and described herein.

Referring to FIGS. 4-11, methods of fabricating the multi-layer porous wick structure 300 from a first porous wick layer 310 defining a cap wick layer to a second porous wick layer 320 defining a base wick layer are depicted. Referring to FIG. 4, a negative mold 210 of a first mold set 200 for forming a first porous wick layer 310 defining a cap wick layer is depicted. In some embodiments, the negative mold 210 comprises a first surface 212, a second surface 214, one or more sidewalls 216, a plurality of holes 218 and a plurality of posts 220. The second surface 214 is offset from the first surface 212. The one or more sidewalls 216 extend around a perimeter of the second surface 214 and between the first surface 212 and the second surface 214. The second surface 214 and the one or more sidewalls 216 define a cavity 222 in the first surface 212 of the negative mold 210 of the first mold set 200. The cavity 222 depicted in FIG. 4 has a perimeter generally defined by a square and has a generally planar second surface 214. However, in other embodiments the cavity 222 may have a perimeter defined by a circle or other closed shape. Additionally, in some embodiments, the second surface 214 may include negative or positive contours or surface enhancement features to form a corresponding positive or negative contour or surface enhancement in the first porous wick layer 310 formed within the cavity 222 of the negative mold 210 of the first mold set 200.

Figure 7:
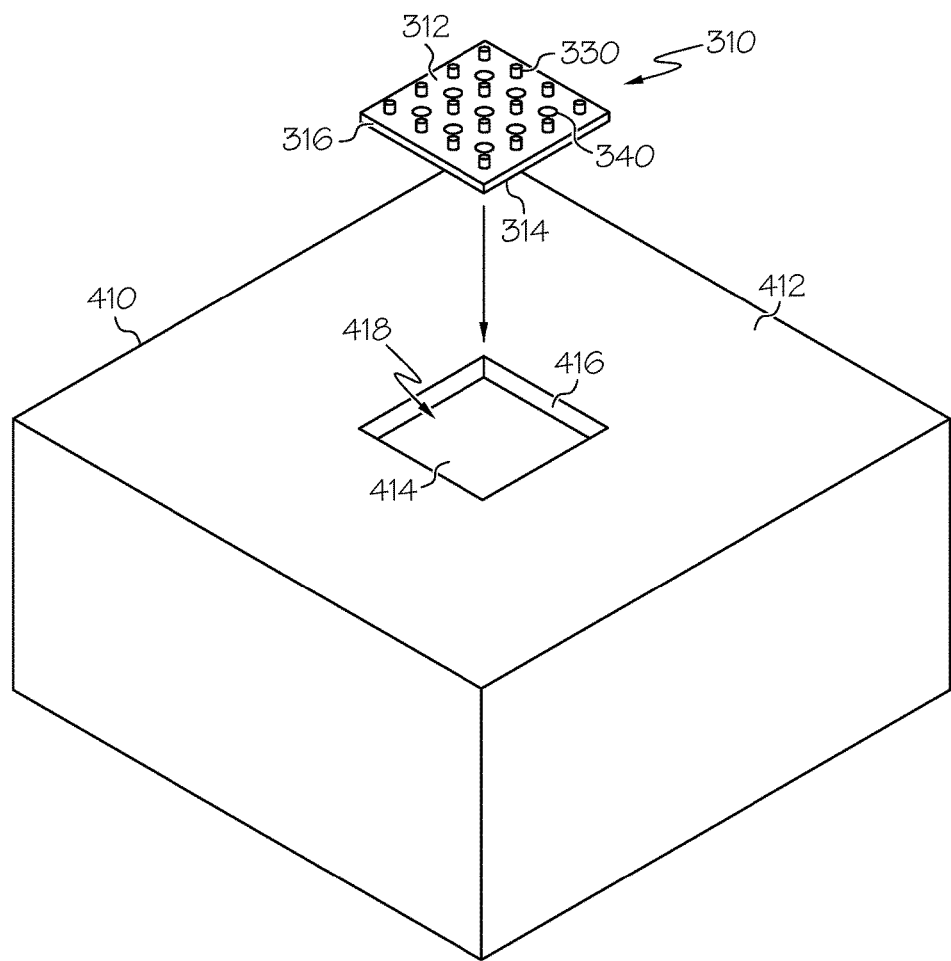
FIG. 7 schematically depicts a perspective view of an example negative mold of a second mold set receiving a first porous wick layer according to one or more embodiments shown and described herein.

Within the cavity 222, the plurality of holes 218 extend from the second surface 214 into the negative mold 210, i.e., generally away from a plane defined by the first surface 212. The plurality of holes 218 are cavities for forming the plurality of porous liquid supply posts 330 (as shown in FIG. 7) as described herein. The plurality of holes 218 may vary in shape and size depending on the design requirements needed to increase or decrease capillary action through the plurality of porous liquid supply posts 330 to portions of the base wick layer or the need to increase or decrease surface area available for boiling and evaporating cooling fluid from the base wick layer. The shape and size of the plurality of holes 218 may be determined in response to mitigating localized hotspots of the base wick layer.

Additionally, the plurality of posts 220 form a plurality of through-holes 340 in the first porous wick layer 310 defining vapor vents in the resulting multi-layer porous wick structure 300. The plurality of posts 220 extend from the second surface 214 toward the plane defined by the first surface 212. In some embodiments, the plurality of posts 220 extend a height from the second surface 214 equal to or greater than the thickness of the first porous wick layer 310 to be formed. In some embodiments, the plurality of posts 220 extend a height that is at least equal to the depth of the cavity 222 defined by the offset of the second surface 214 from the first surface 212 of the negative mold 210 of the first mold set 200. In other embodiments, the plurality of posts 220 extend from the second surface 214 to or above the plane defined by the first surface 212 of the negative mold 210 of the first mold set 200.

Figure 5:
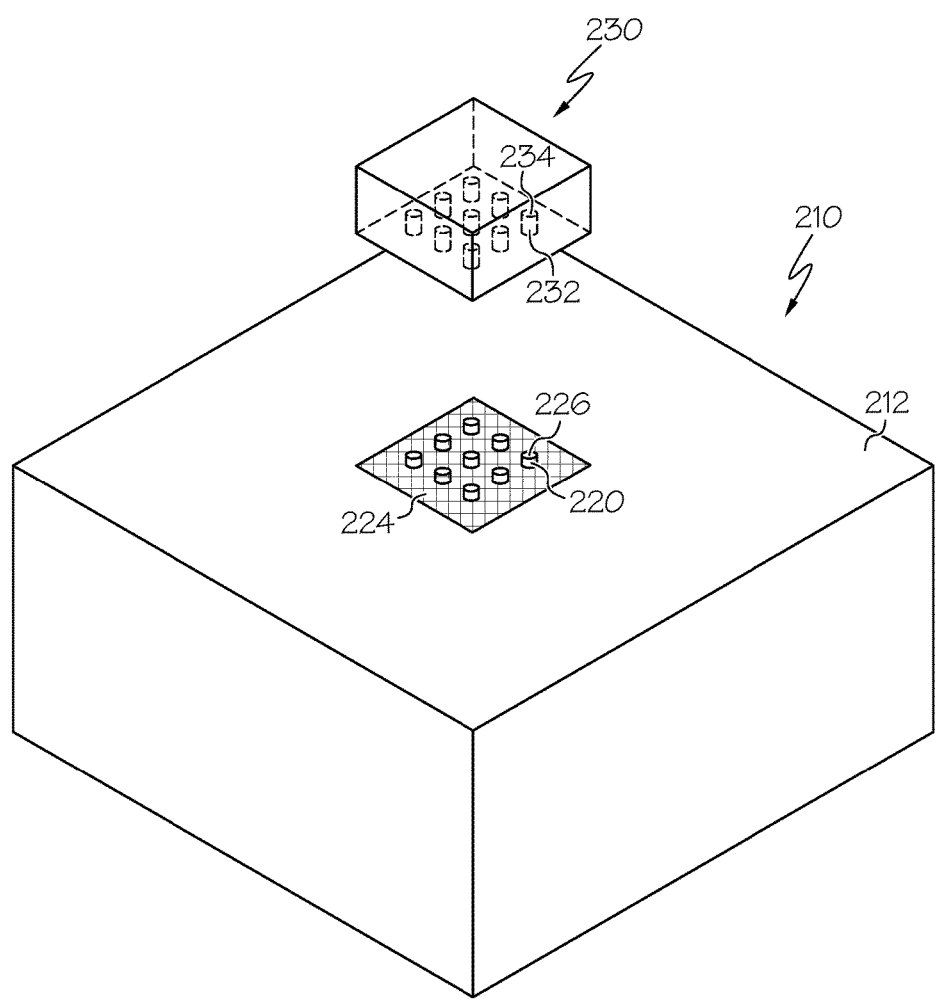
FIG. 5 schematically depicts a perspective view of an example first mold set assembly having a positive mold and a negative mold according to one or more embodiments shown and described herein.

Referring now to FIG. 5, an example first mold set 200 assembly comprising the negative mold 210 depicted in FIG. 4 and a positive mold 230 is depicted. Metal particles 224 are introduced in the negative mold 210 of the first mold set. The metal particles 224 fill the plurality of holes 218 of the negative mold 210 of the first mold set 200. Additionally, metal particles 224 may fill the cavity 222 from the second surface 214 of the negative mold 210 to the plane defined by the first surface 212 of the negative mold 210. In other embodiments, the metal particles 224 fill a portion of the cavity 222 of the negative mold 210 to a desired depth between the second surface 214 and the plane defined by the first surface 212. In each embodiment, however, metal particles 224 are not added beyond the tops 226 of the plurality of posts 220, unless compression of the metal particles 224 by the positive mold 230 of the first mold set 200 results in a first porous wick layer 310 having a thickness less than the height of the plurality of posts 220 such that a plurality of through-holes 340 are formed by the plurality of posts 220 in the first porous wick layer 310.

Still referring to FIG. 5, the positive mold 230 of the first mold set comprises a plurality of holes 232 corresponding to the plurality of posts 220 in the negative mold 210 of the first mold set 200. For example, as depicted in FIG. 5, the negative mold 210 is filled with metal particles 224 up to the plane defined by the first surface 212 of the negative mold 210. The plurality of posts 220 extend beyond the plane defined by the first surface 212 of the negative mold 210 to form corresponding plurality of through-holes 340 in the first porous wick layer 310. Additionally, the positive mold 230 of the first mold set 200 is aligned with the negative mold 210 of the first mold set 200 such that the plurality of posts 220 interface with the plurality of holes 232. In some embodiments, the plurality of holes 232 extend into the positive mold 230 of the first mold set 200 to a depth greater than the height of the plurality of posts 220 of the negative mold 210. The greater depth allows the positive mold 230 to compress the metal particles 224 during sintering such that the plurality of posts 220 of the negative mold 210 will not bottom out against the base 234 of the plurality of holes 232 during sintering. In other embodiments, the depth of the plurality of holes 232 is less than the height of the plurality of posts 220 of the negative mold 210 but sufficiently deep to allow for compaction of the metal particles 224 as shown in the cross-sectional view of FIG. 6B while maintaining a gap 228 between the plurality of posts 220 and the base 234 of the plurality of holes 232.

Figure 6A:
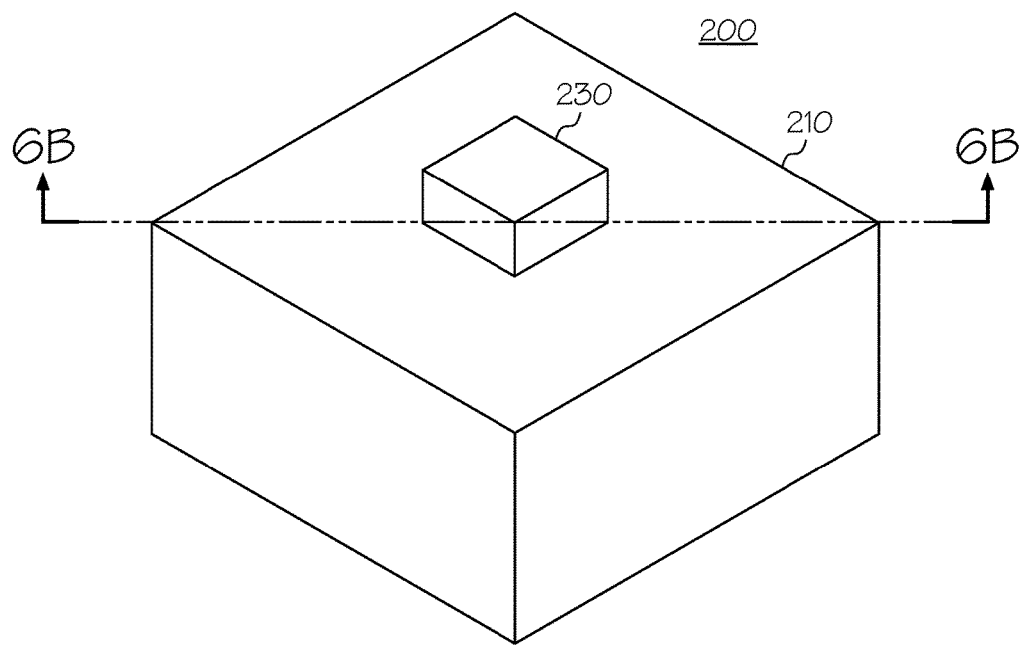
FIG. 6A schematically depicts a perspective view of an example first mold set assembly according to one or more embodiments shown and described herein.
Figure 6B:
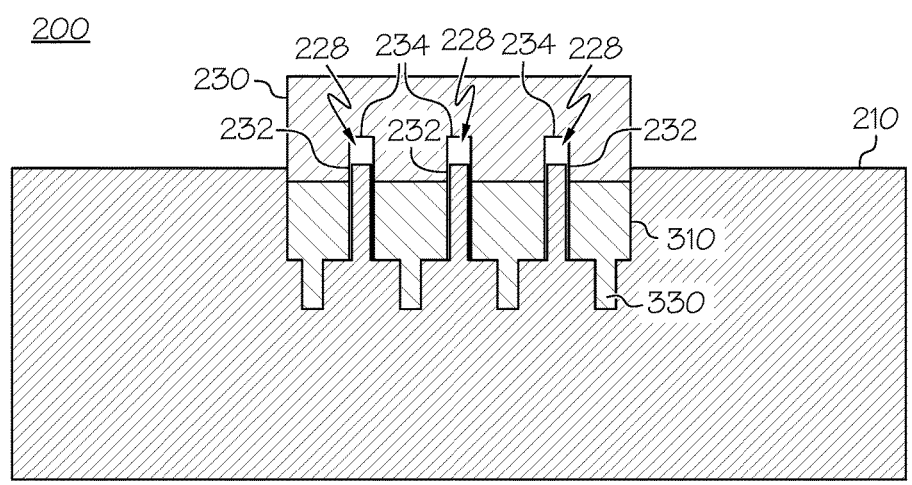
FIG. 6B schematically depicts a cross-sectional view of the example first mold set assembly of FIG. 6A according to one or more embodiments shown and described herein.

Referring to FIGS. 6A and 6B, an example assembly of the first mold set 200 for sintering the metal particles 224 within is depicted. Generally, sintering is a process of forming a solid material by applying heat and pressure for a period of time while not melting the material to the point of liquefaction. In some embodiments, sintering comprises applying a pressure and heat at an elevated temperature to the metal particles 224 in the first mold set for a period of time in a reducing or inert atmosphere. The sintering pressure and temperature are determined based on the type of particles being sintered and the desired porosity of the resulting multi-layer porous wick structure. In other embodiments, the porosity of the multi-layer porous wick structure can be controlled by the sintering time and the sintering temperature. In some embodiments, the sintering temperature is about 750 degrees Celsius to about 1000 degrees Celsius. Optionally, the sintering temperature is 100 degrees Celsius to about 300 degrees Celsius or 590 degrees Celsius to about 620 degrees Celsius or 850 degrees Celsius to about 950 degrees Celsius or 740 degrees Celsius to about 780 degrees Celsius or 200 degrees Celsius to about 1600 degrees Celsius. In some embodiments, the sintering time is about 1 hour to about 32 hours. In other embodiments, the sintering time is optionally about 5 minutes, about 10 minutes, about 15 minutes, about 30 minutes, about 45 minutes, about 1 hour, about 6 hours, about 12 hours, about 18 hours, about 24 hours or about 30 hours. The higher the sintering temperature, the shorter the sintering time required to achieve a desired degree of bonding between the particles in the particle compact. The porosity of the multi-layer porous wick structure may be examined through X-ray microtomography scanning and subsequently the sintering temperature and sintering time may be adjusted to achieve the desired porosity.

Sintering the metal particles 224 in the first mold set 200, for example as depicted in FIGS. 6A and 6B forms a first porous wick layer 310. The first porous wick layer 310 is then extracted from the first mold set 200 and configured with a negative mold 410 of a second mold set 400.

Referring to FIG. 7, a negative mold 410 of the second mold set 400 and the first porous wick layer 310 are depicted. For example, without limitation, the first porous wick layer 310 comprises a first surface 312 opposite a second surface 314, one or more sidewalls 316 extending around a perimeter of the first porous wick layer 310 between the first surface 312 and the second surface 314, a plurality of through-holes 340 extending between the first surface 312 and the second surface 314 and a plurality of porous liquid supply posts 330 extending from the first surface 312 to a height defined by the depth of the plurality of the holes 218 in the negative mold 210 of the first mold set 200. The negative mold 410 of the second mold set 400 comprises a cavity 418 defined by a base surface 414 offset from a negative mold top surface 412 enclosed by one or more sidewalls 416 extending around a perimeter of the base surface 414 and between the cavity base surface 414 and the negative mold top surface 412. The cavity 418 defined by the base surface 414 and one or more sidewalls 416 is contoured for receiving the first porous wick layer 310. In some embodiments, the second surface 314 of the first porous wick layer 310 is configured adjacent to the base surface 414 of the negative mold 410 of the second mold set 400.

Figure 8A:
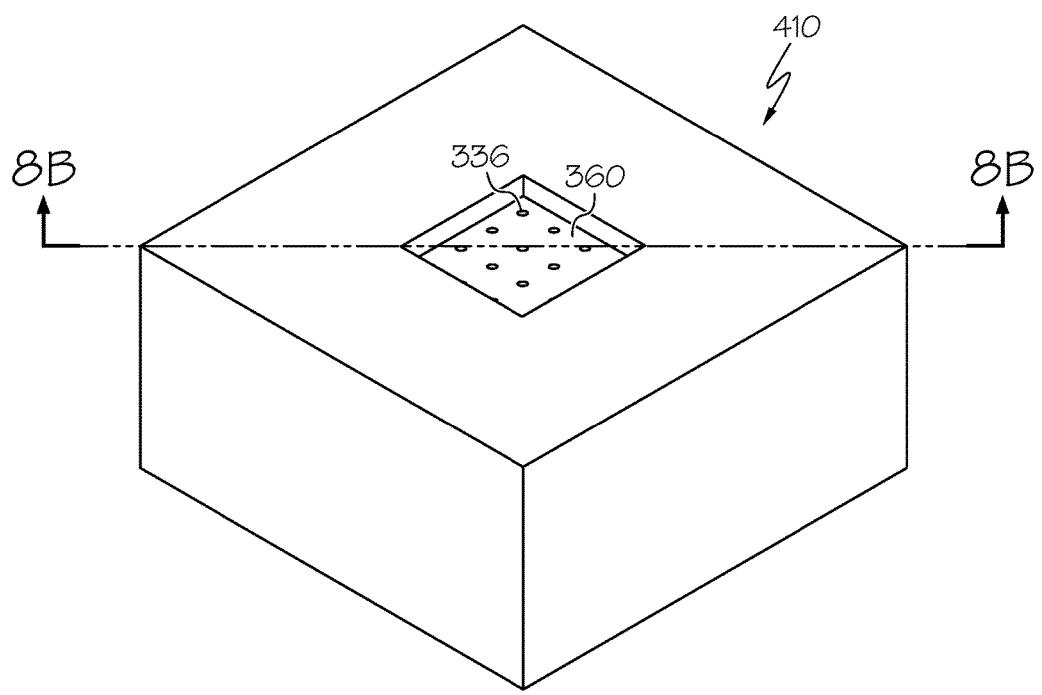
FIG. 8A schematically depicts a perspective view of an example sacrificial layer formed with the first porous wick layer in the negative mold of the second mold set according to one or more embodiments shown and described herein.
Figure 8B:
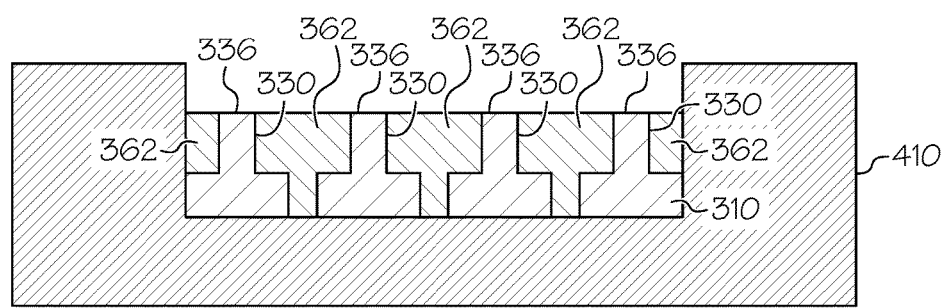
FIG. 8B schematically depicts a cross-sectional view of the example negative mold of the second mold set in FIG. 8A having a sacrificial layer formed with the first porous wick layer according to one or more embodiments shown and described herein.

Once the first porous wick layer 310 is configured in the negative mold 410 of the second mold set 400, filler particles 360 are introduced to the negative mold 410 of the second mold set 400 with the first porous wick layer 310 as shown in FIG. 8A. The filler particles 360 form a sacrificial layer 362 over the first porous wick layer 310. In some embodiments, to form the sacrificial layer 362, the filler particles 360 are compacted. The sacrificial layer 362 extends no more than the height of the plurality of porous liquid supply posts 330 as shown in FIG. 8B. FIG. 8B depicts a cross-sectional view of the negative mold 410 of the second mold set 400 with the first porous wick layer 310 and the sacrificial layer 362. By not extending the sacrificial layer 362 over the top 336 of the plurality of porous liquid supply posts 330, the sacrificial layer 362 allows the later added metal particles to couple with at least the tops 336 of the porous liquid supply posts 330 of the first porous wick layer 310. In some embodiments, the sacrificial layer 362 extends only a portion of the height of the plurality of porous liquid supply posts 330 thus leaving more than the top 336 of the plurality of porous liquid supply posts 330 exposed for coupling to the later added and sintered metal particles. Additionally, the sacrificial layer 362 defines interstitial spaces around the plurality of porous liquid supply posts 330 and between the first porous wick layer 310 and the later formed second porous wick layer 320.

In some embodiments, the filler particles 360 are carbonate particles. However, the filler particles 360 are not limited to carbonate particles. Rather, the filler particles 360 may be any material that decomposes at the elevated sintering temperatures thereby leaving behind only features formed by the sintered particles. The filler particles 360 for example carbonate particles, decompose during a process referred to as a lost-carbonate sintering (LCS) process.

In some embodiments, the filler particles 360 are compacted by an intermediate positive mold 430. As a non-limiting example, the intermediate positive mold 430 may have a generally planar surface for compacting the sacrificial layer, for example in FIG. 8B. In other embodiments, contours 364 may be formed in the sacrificial layer 362 with an intermediate positive mold 430 such as, without limitation, the embodiment depicted in FIG. 8C. The intermediate positive mold 430 compacts the sacrificial layer 362 with a contoured surface 432 thereby forming contours 364 in the sacrificial layer 362.

Once the sacrificial layer 362 is formed, metal particles 366 are introduced with the first porous wick layer 310 and the sacrificial layer 362 in the negative mold 410 of the second mold set 400. Referring to FIGS. 9A, 9B and 9C, an example second mold set 400 assembly having a positive mold 420 interfacing with the negative mold 410 is depicted. FIG. 9A depicts the assembly of the positive mold 420 and negative mold 410. FIGS. 9B and 9C depict example cross-sections of the second mold set 400 assembly of FIG. 9A. In FIG. 9B, the metal particles 366 are sintered with the first porous wick layer 310 having a sacrificial layer 362 without contours 364 for surface enhancement features. Conversely, FIG. 9C depicts a cross-section of the second mold set 400 assembly where the sacrificial layer 362 includes contours 364 for surface enhancement features 350 to be formed in second porous wick layer 320 formed by sintering the metal particles 366 introduced within. In some embodiments, the multi-layer porous wick structure 300 includes surface enhancement features 350 formed with the second porous wick layer 320. The sintering of the metal particles 366 forms a second porous wick layer 320 coupled to the plurality of porous liquid supply posts 330 of the first porous wick layer 310. The sacrificial layer 362 decomposes during the sintering process leaving a multi-layer porous wick structure 300 within the negative mold 410 of the second mold set 400 after sintering. In some embodiments of the fabrication method, a copper plate (not shown) may be included between the positive mold 420 of the second mold set 400 and the metal particles 366 over the sacrificial layer 362 in the negative mold 410 of the second mold set 400. As described in more detail below, the copper plate may form the evaporator layer that contacts a heat-generating device or optionally be used to form the vapor chamber apparatus. The multi-layer porous wick structure 300 formed through the fabrication method described and depicted with reference to FIGS. 4-9C resembles the multi-layer porous wick structure 100 depicted in FIG. 1.

Figure 8C:
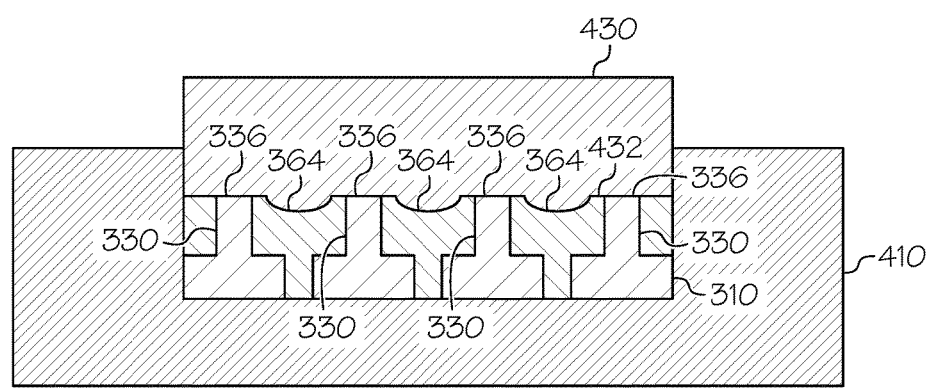
FIG. 8C schematically depicts a cross-sectional view of an example second mold set for forming surface enhancement features within the sacrificial layer according to one or more embodiments shown and described herein.
Figure 9A:
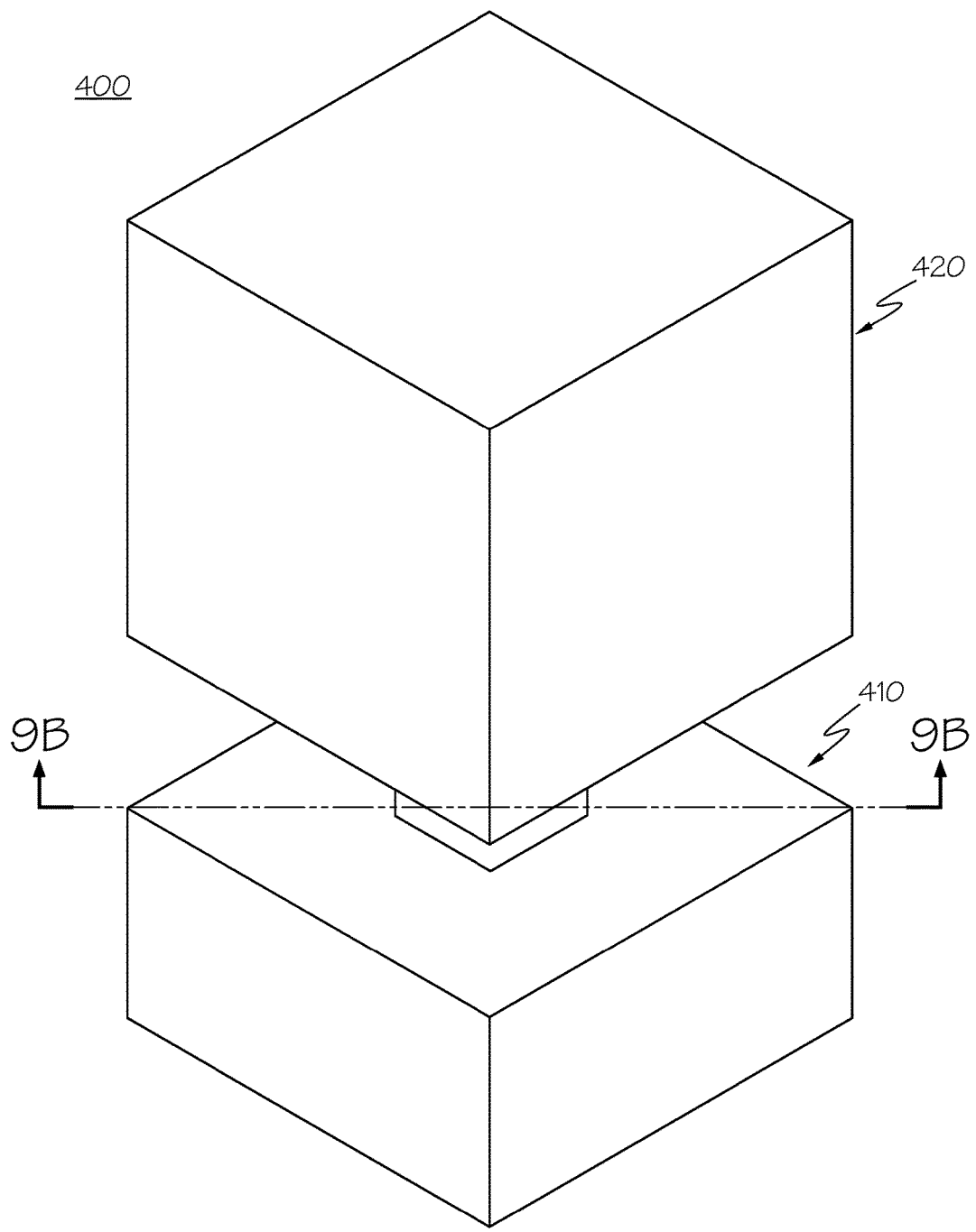
FIG. 9A schematically depicts a perspective view of an example second mold set assembly having a positive mold and a negative mold according to one or more embodiments shown and described herein.
Figure 9B:
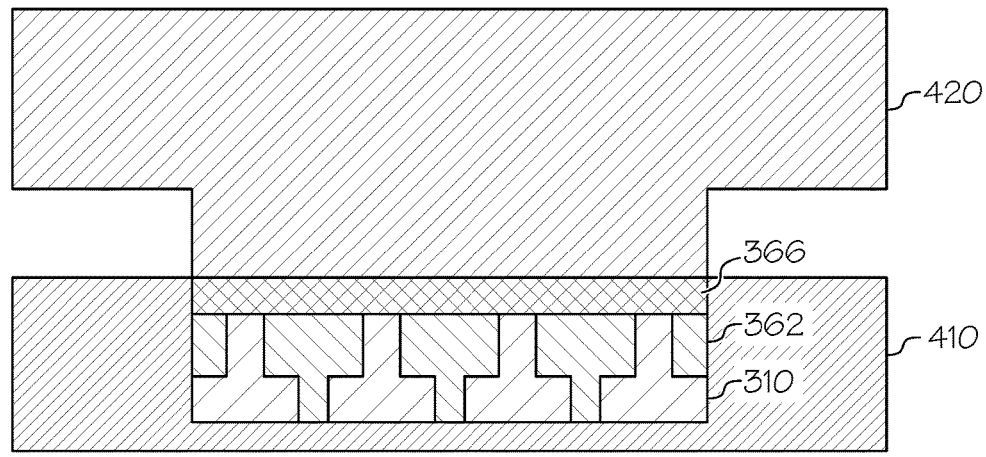
FIG. 9B schematically depicts a cross-sectional view of the example second mold set assembly of FIG. 9A according to one or more embodiments shown and described herein.
Figure 9C:
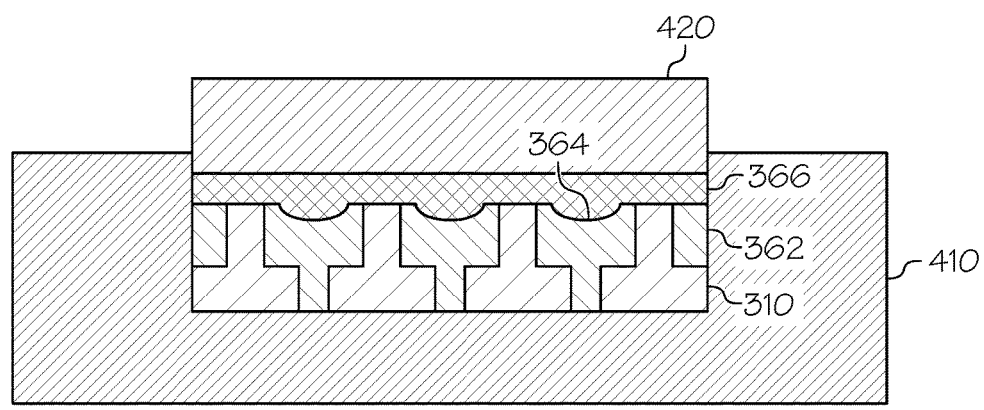
FIG. 9C schematically depicts a cross-sectional view of an example second mold set assembly for forming a second porous wick layer with surface enhancement features according to one or more embodiments shown and described FIG. 10 schematically depicts a cross-sectional view of an example mold set for forming a multi-layer wick structure having a liquid supply wick according to one or more embodiments shown and described herein.
Figure 10:
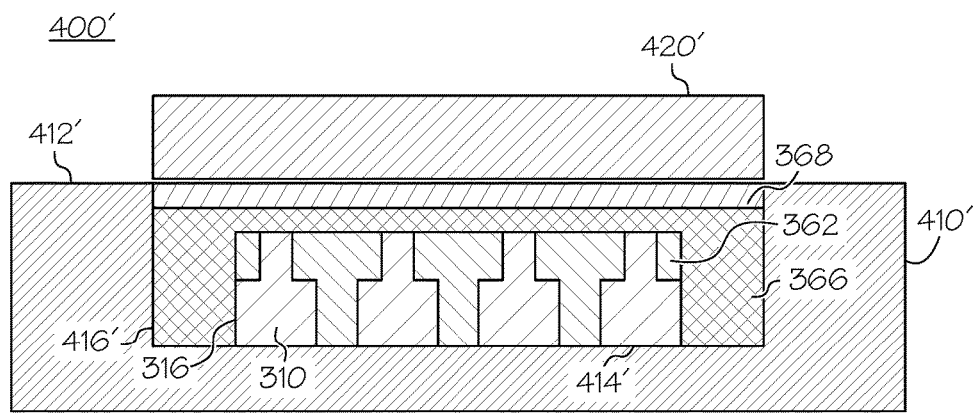
Figure 11:
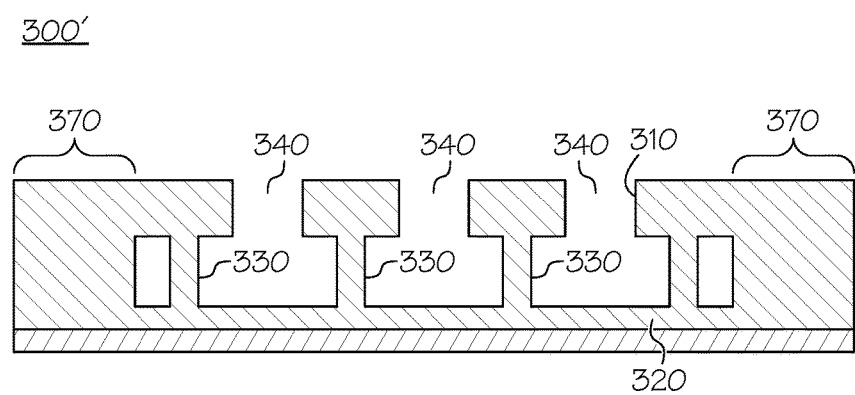
FIG. 11 schematically depicts a cross-sectional view of an example multi-layer wick structure having a liquid supply wick according to one or more embodiments shown and described herein.

Referring to FIGS. 10 and 11, in a further embodiment of the fabrication method described above, once the sacrificial layer 362 is formed with the first porous wick layer 310, as depicted in FIGS. 8B and 8C, the negative mold 410 may be modified, for example, without limitation, the negative mold 410 may include an insert that can be selectively removed or a third mold set 400' having a negative mold 410' and a corresponding positive mold 420' is provided. In either embodiment, the negative mold 410' still comprises a cavity 418' defined by a base surface 414' offset from a negative mold top surface 412' enclosed by one or more sidewalls 416' extending around a perimeter of the base surface 414' and between the base surface 414' and the negative mold top surface 412'. The increased cavity 418' size of the negative mold 410' now includes space between the one or more sidewalls 316 of the first porous wick layer 310 and the one or more sidewalls 416' of the negative mold 410' extending around a perimeter of the base surface 414'. Metal particles 366 are introduced within the space between the one or more sidewalls 416' and one or more sidewalls 316. Then a corresponding positive mold 420' interfaces with the negative mold 410', as shown in FIG. 10. In some embodiments, a thermally conductive plate 368 may be introduced between the positive mold 420' and the metal particles 366 prior to sintering. FIG. 11 depicts a cross-section of the resulting multi-layer porous wick structure 300'. The multi-layer porous wick structure 300' comprises a first porous wick layer 310 defining the cap wick layer, the second porous wick layer 320 defining the base wick layer, a plurality of porous liquid supply posts 330, a plurality of through-holes 340 defining vapor vents within the cap wick layer and a liquid supply wick 370 coupled to the cap wick layer and the base wick layer.

Figure 12:
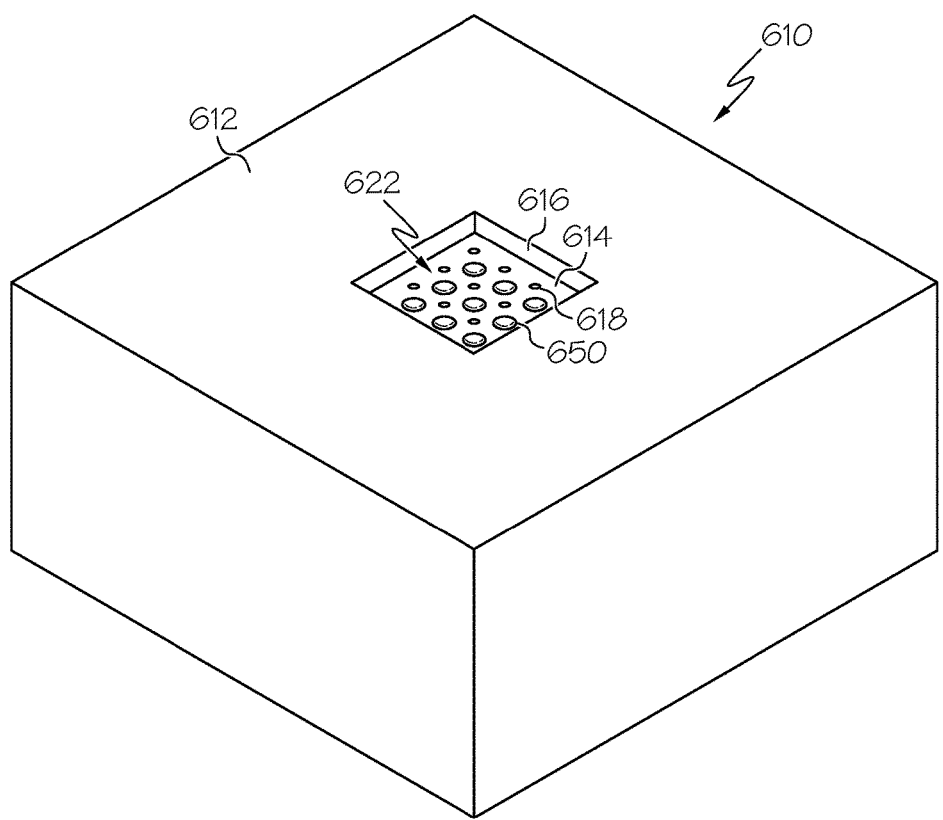
FIG. 12 schematically depicts a perspective view of another example negative mold of another example first mold set according to one or more embodiments shown and described herein.

Referring to FIGS. 12-25, methods of fabricating the multi-layer porous wick structure 500 from a first porous wick layer 510 defining a base wick layer to a second porous wick layer 520 defining a cap wick layer are depicted. Referring to FIG. 12, a negative mold 610 of a first mold set 600 is depicted. In some embodiments, the negative mold 610 comprises a first surface 612, a second surface 614, one or more sidewalls 616, a plurality of holes 618 and optionally a plurality of dimples 650. The second surface 614 is offset from the first surface 612. The one or more sidewalls 616 extend around a perimeter of the second surface 614 and between the first surface 612 and the second surface 614. The second surface 614 and the one or more sidewalls 616 define a cavity 622 in the first surface 612 of the negative mold 610 of the first set of molds 600. The cavity 622 depicted in FIG. 12 has a perimeter generally defined by a square and has a generally planar second surface 614. However, in other embodiments the cavity 622 may have a perimeter defined by a circle or other closed shape.

Within the cavity 622, the plurality of holes 618 extend from the second surface 614 into the negative mold 610, i.e., generally away from a plane defined by the first surface 612. The plurality of holes 618 are cavities for forming the plurality of porous liquid supply posts 530 as described herein. The plurality of holes 618 may vary is shape and size depending on the design requirements needed to increase or decrease capillary action through the plurality of porous liquid supply posts 530 to portions of the base wick layer or the need to increase or decrease surface area available for boiling and evaporating cooling fluid from the base wick layer. The shape and size of the plurality of holes 618 may be determined in response to mitigating localized hotspots of the base wick layer. Additionally, the plurality of dimples 650 form surface enhancement features 550 in the first porous wick layer 510 defining the base wick layer in FIG. 12. As described above, the surface enhancement features 550 may comprise a variety of sizes, shapes and locations within the multi-layer porous wick structure.

Figure 13:
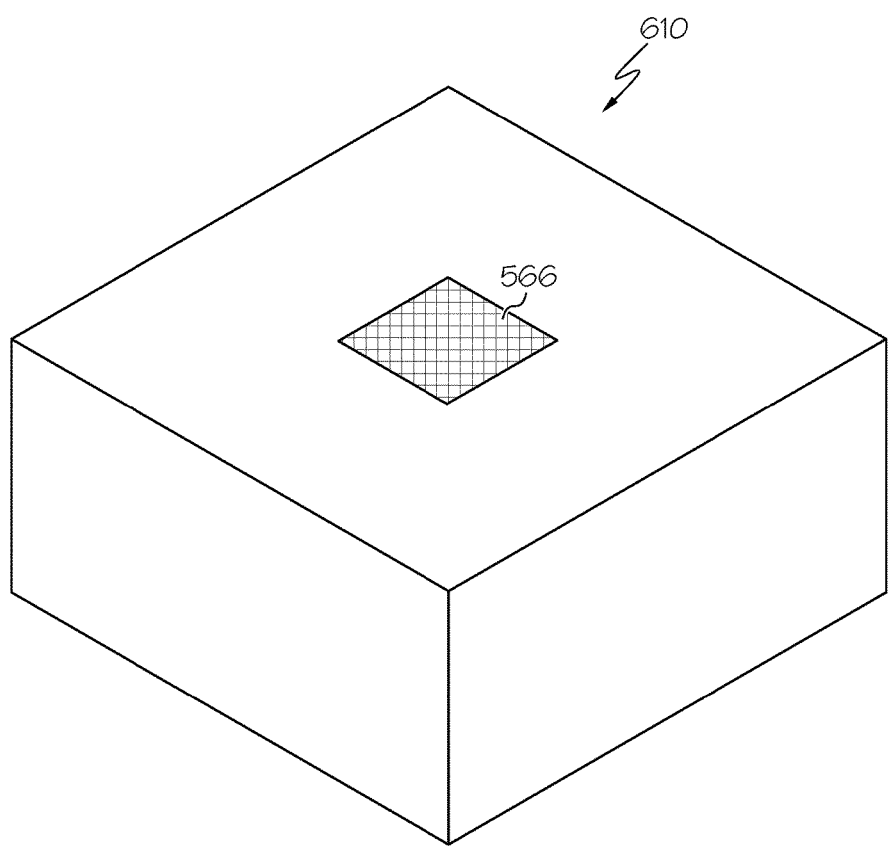
FIG. 13 schematically depicts a perspective view of an the example negative mold of the example first mold set with metal particles prior to sintering according to one or more embodiments shown and described herein.
Figure 14A:
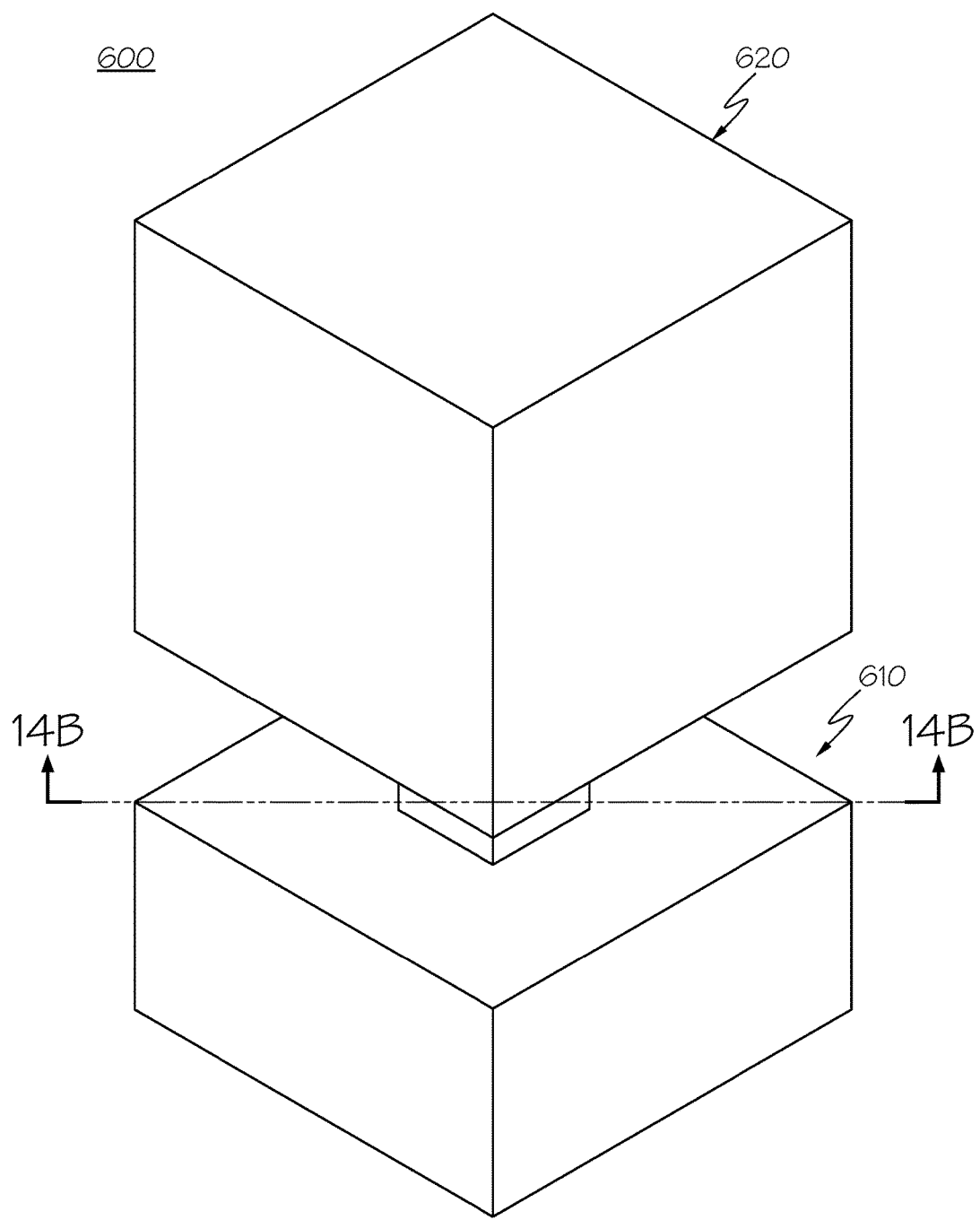
FIG. 14A schematically depicts a perspective view of an example first mold set assembly having a positive mold and a negative mold for sintering a first porous wick layer according to one or more embodiments shown and described herein.
Figure 14B:
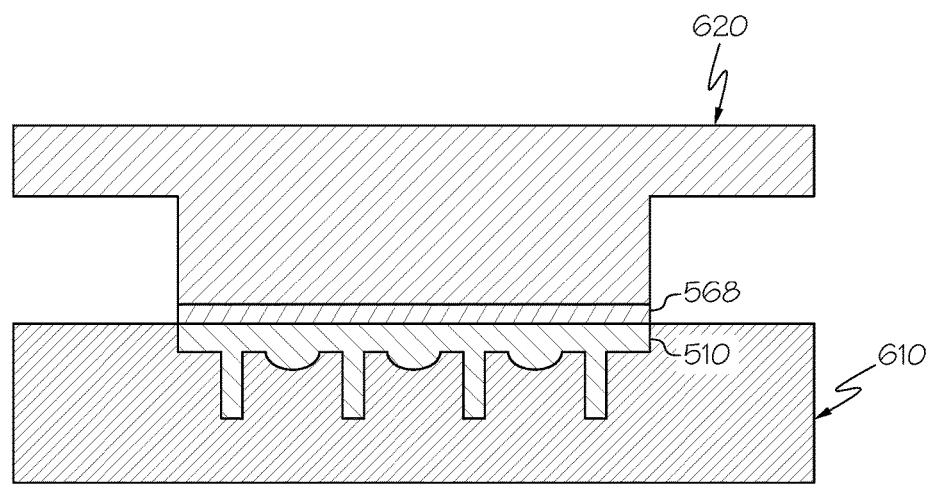
FIG. 14B schematically depicts a cross-sectional view of an example first mold set assembly of FIG. 14A having a positive mold and a negative mold for sintering a first porous wick layer according to one or more embodiments shown and described herein.

Referring to FIG. 13, metal particles 566 are introduced in the cavity 622 of the negative mold 610 of the first mold set 600. Once the metal particles 566 are in the cavity 622 of the negative mold 610 of the first mold set 600, the positive mold 620 of the first mold set 600 interfaces with the negative mold 610 of the first mold set 600 for sintering of the metal particles 566 as shown in FIG. 14A. Referring to FIG. 14B a cross-section of FIG. 14A is depicted. In FIG. 14B, an optional copper plate 568 is included between the positive mold 620 and the metal particles 566 prior to sintering. As described in more detail herein, the copper plate 568 may form an evaporator layer that contacts the heat-generating device or is optionally used to form the vapor chamber apparatus.

Figure 15:
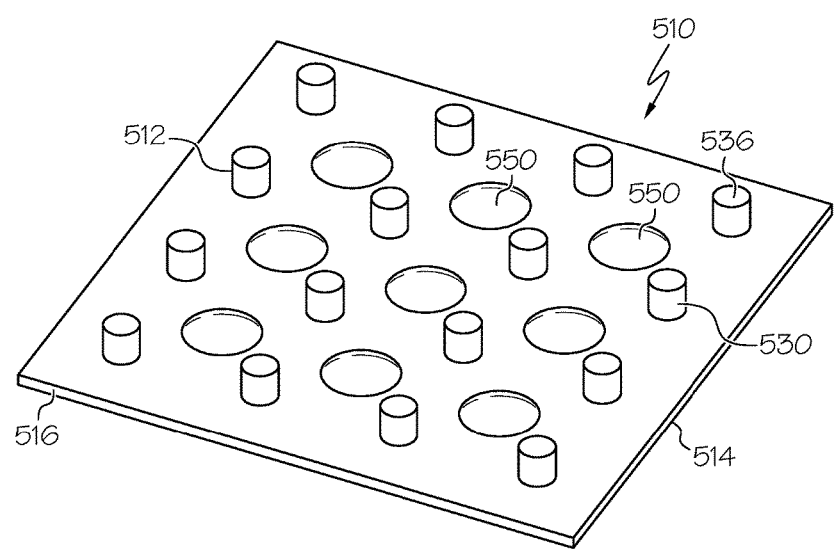
FIG. 15 schematically depicts a perspective view of another example first porous wick layer according to one or more embodiments shown and described herein.

Referring to FIG. 15, a first porous wick layer 510 defining a base wick layer is formed as a result of sintering the metal particles 566 in the negative mold 610 of the first mold set 600. For example, without limitation, the first porous wick layer 510 comprises a first surface 512 opposite a second surface 514, one or more sidewalls 516 extending around a perimeter of the first porous wick layer 510 between the first surface 512 and the second surface 514, a plurality of porous liquid supply posts 530 extending from the first surface 512 to a height defined by the depth of the plurality of the holes 618 in the negative mold 610 of the first mold set 600 and a plurality of surface enhancement features 550 intertwined among the plurality of porous liquid supply posts 530 on the first surface 512.

Figure 16:
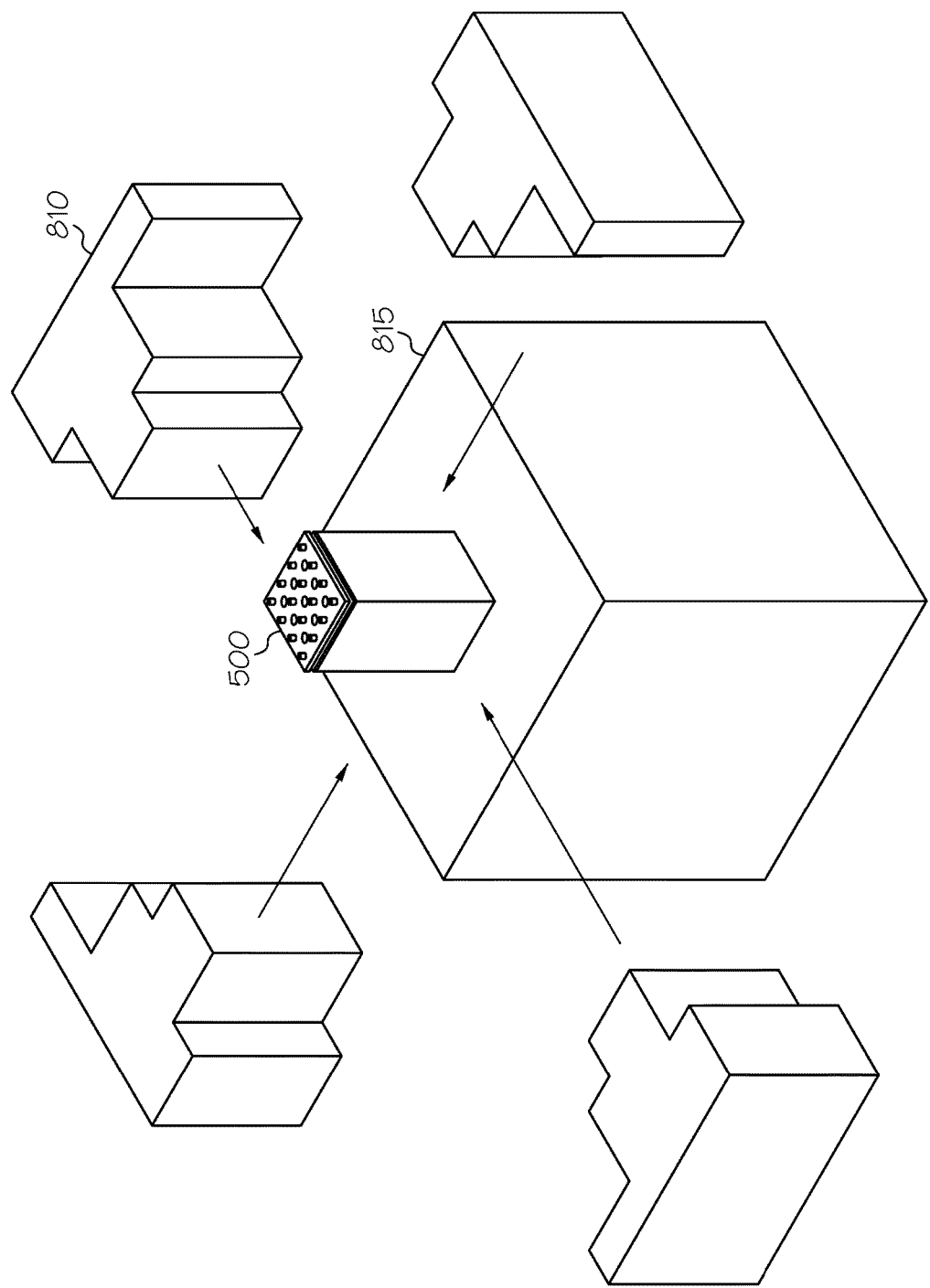
FIG. 16 schematically depicts a perspective view of another example negative mold of a second mold set receiving a first porous wick layer according to one or more embodiments shown and described herein.

Referring to FIG. 16, a negative mold 810 of the second mold set 800 receives the first porous wick layer 510. The first porous wick layer 510 may be attached a copper block 815 or a copper plate. Therefore, in some embodiments, the negative mold 810 of the second mold set 800 may comprise a number of sections to be assembled about the first porous wick layer 510. For example, without limitation, the negative mold 810 shown in FIG. 16 includes four sections capable of being assembled about the first porous wick layer 510. While FIG. 16 depicts the first porous wick layer 510 being coupled to a copper block 815, the first porous wick layer 510 may also be arranged on a substrate, such as without limitation, a metal plate which is optionally a copper plate and a negative mold 810 may be configured to assemble about the first porous wick layer 510 for further fabrication. Additionally, the negative mold 810 of the second mold set 800 may comprise a number of sections to absorb the coefficient of thermal expansion (CTE) mismatch between the first porous wick layer 510 material and the mold material. In some embodiments, the negative mold 810 may be a single piece and may slide over the first porous wick layer 510 regardless of whether the first porous wick layer 510 is on a copper block, metal plate or other substrate.

Figure 17:
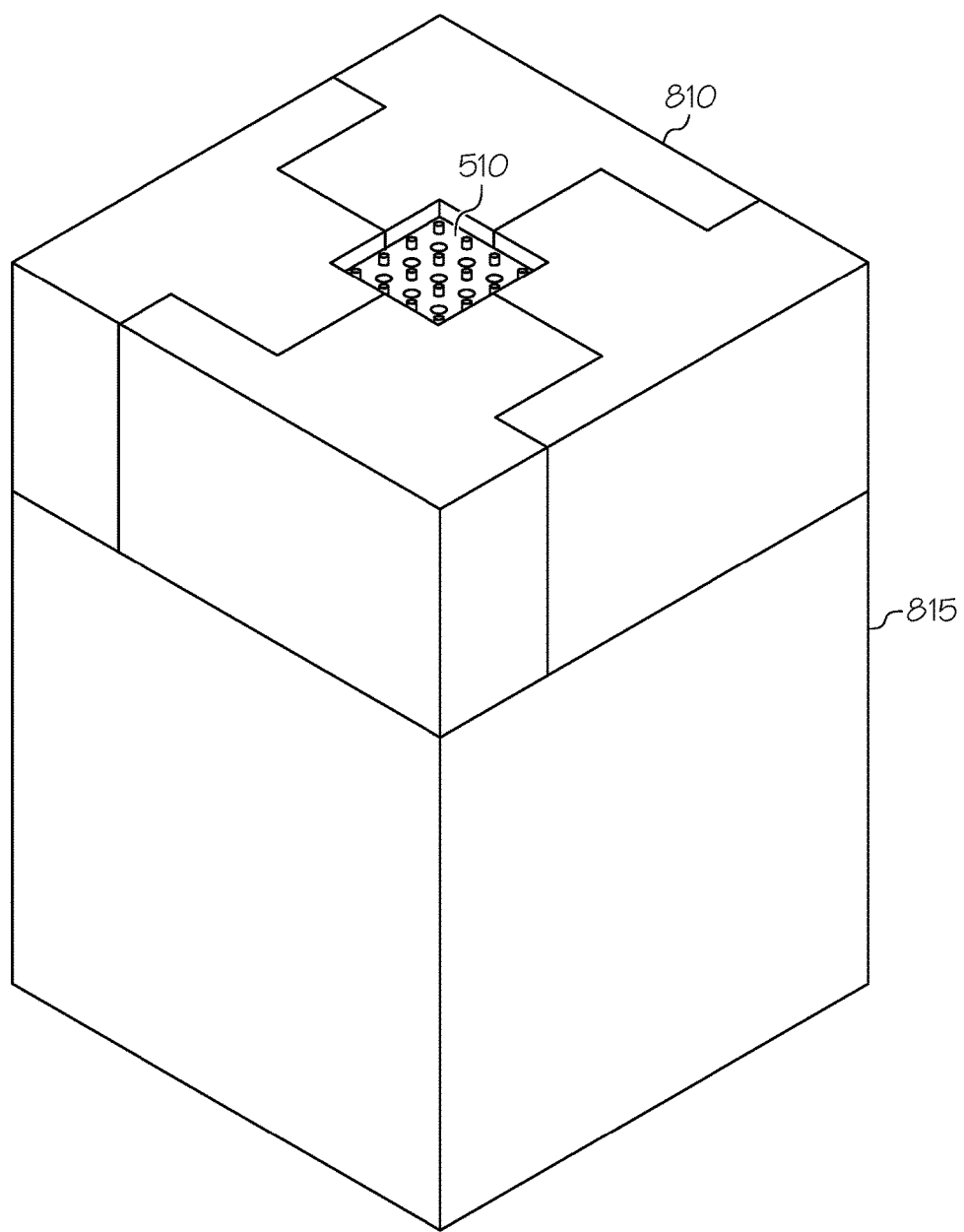
FIG. 17 schematically depicts a perspective view of the example negative mold of the second mold set assembled with the first porous wick layer according to one or more embodiments shown and described herein.
Figure 18A:
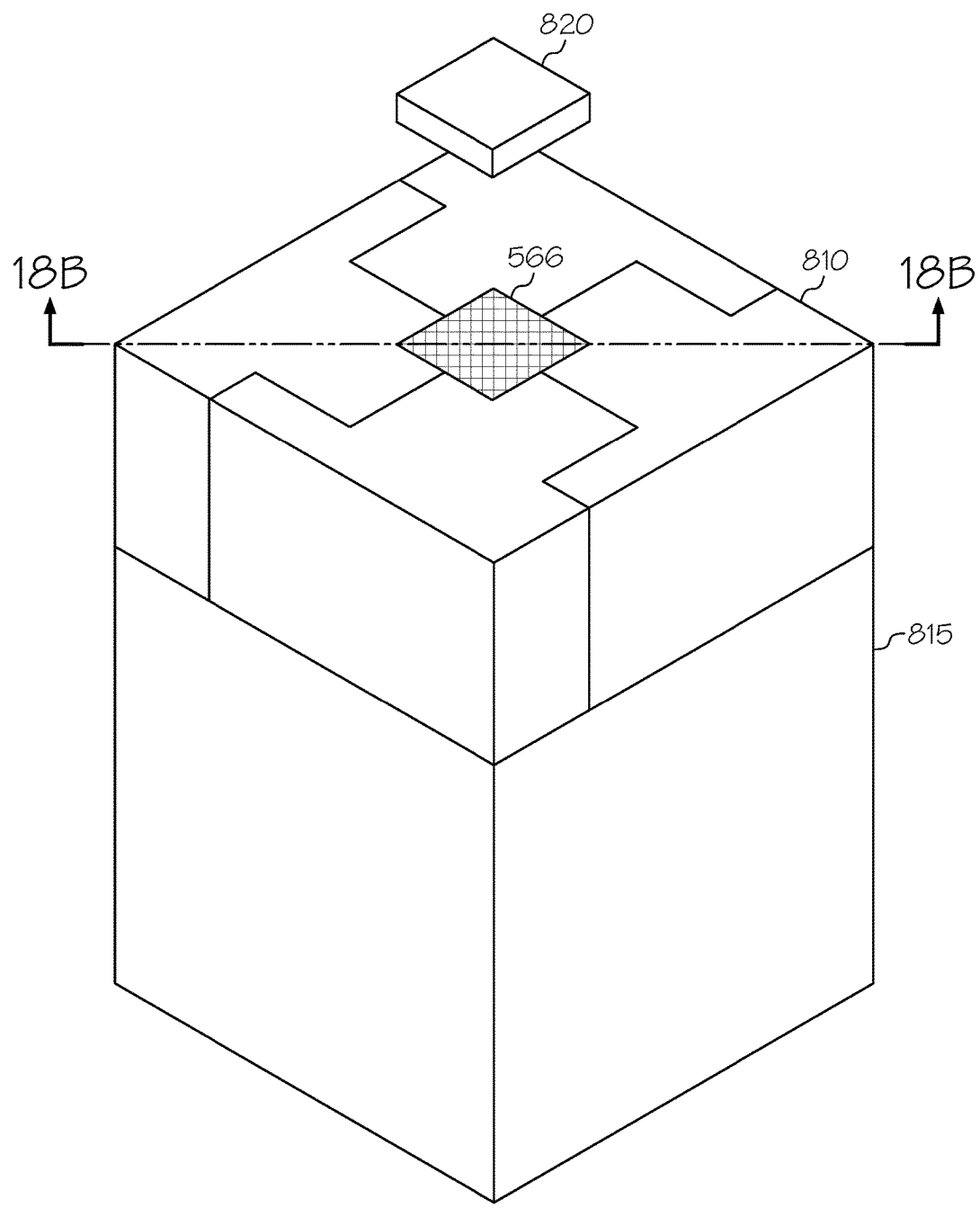
FIG. 18A schematically depicts a perspective view of an example assembly of the second mold set having a positive mold and a negative mold according to one or more embodiments shown and described herein.
Figure 18B:
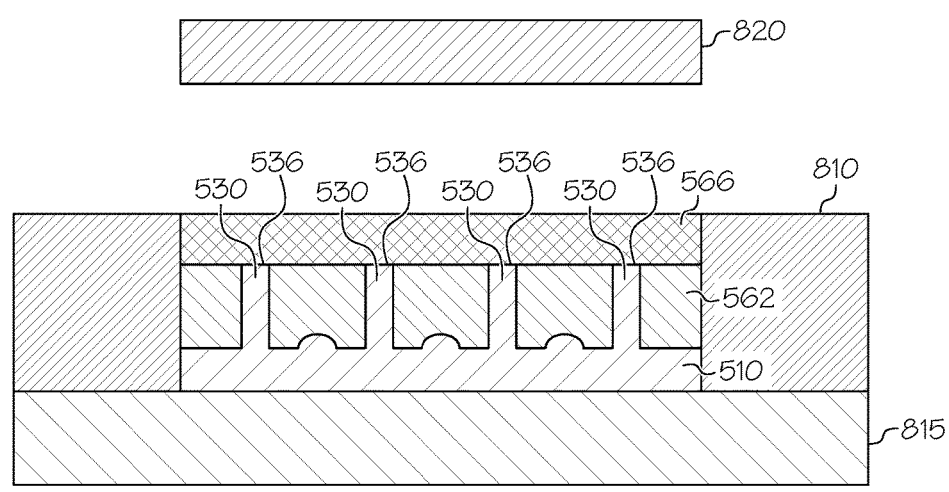
FIG. 18B schematically depicts a cross-sectional view of the example second mold set assembly of FIG. 18A according to one or more embodiments shown and described herein.
Figure 19:
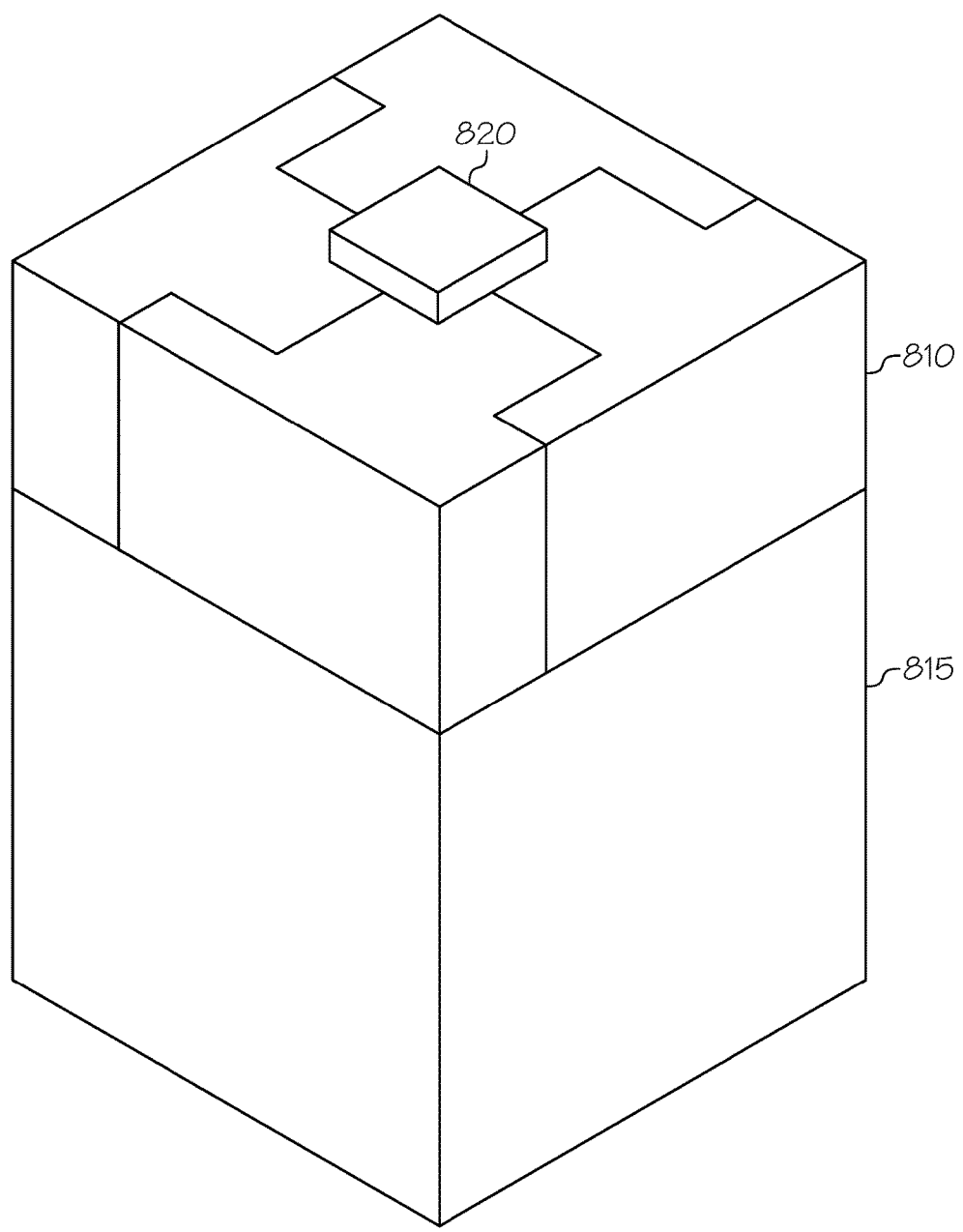
FIG. 19 schematically depicts a perspective view of the example second mold set assembly having a positive mold and a negative mold for sintering an second porous wick layer according to one or more embodiments shown and described herein.
Figure 20:
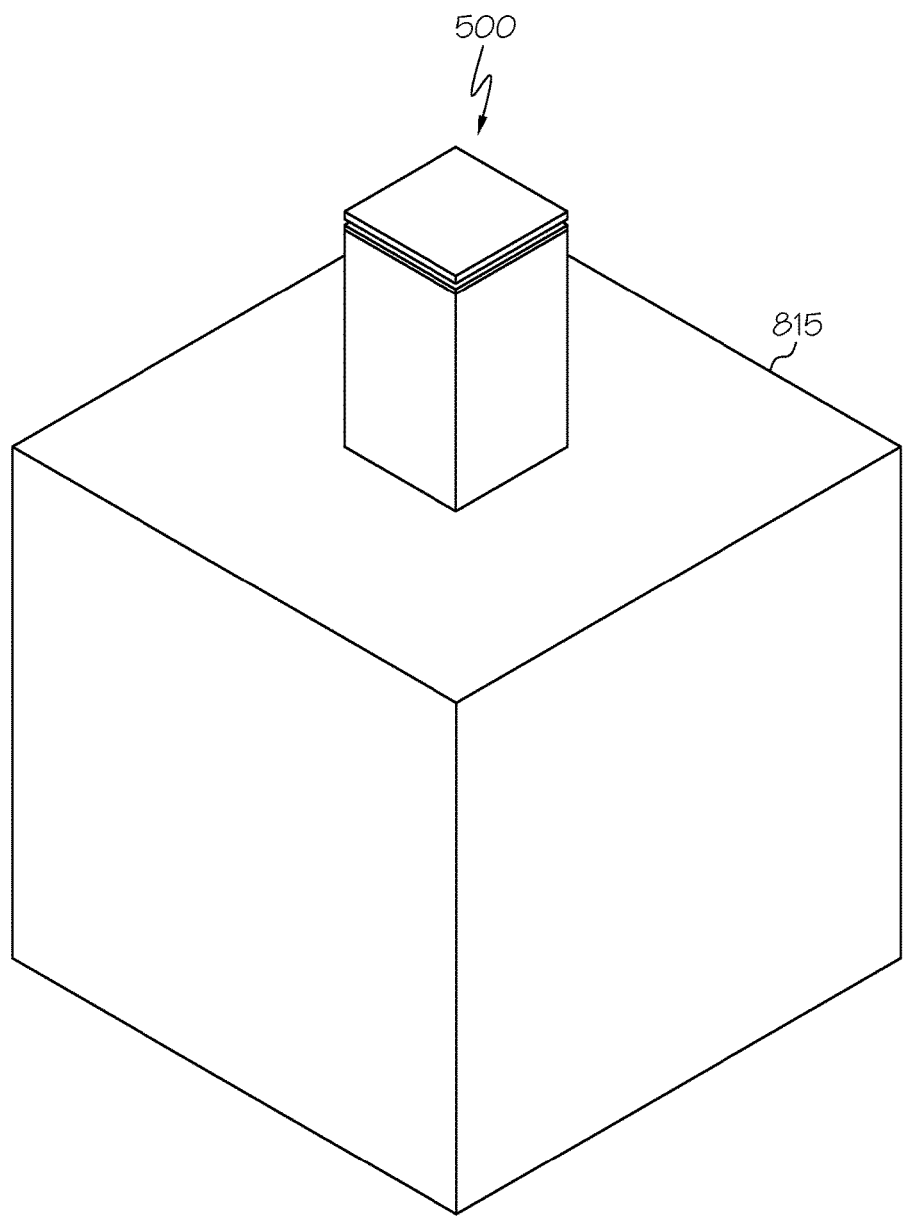
FIG. 20 schematically depicts a perspective view of an example multi-layer porous wick structure post sintering without vapor vents according to one or more embodiments shown and described herein.
Figure 21:
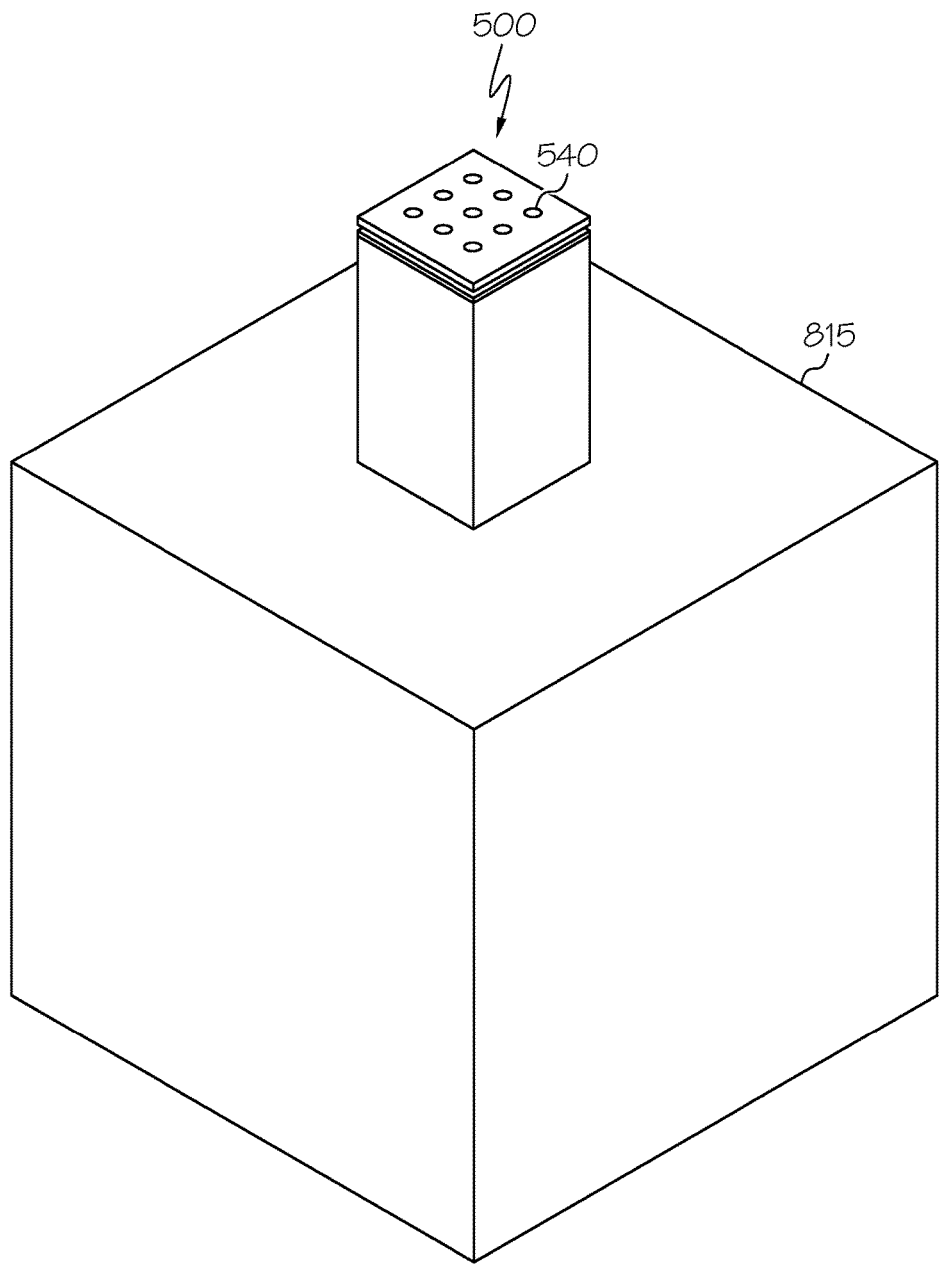
FIG. 21 schematically depicts a perspective view of an example multi-layer porous wick structure post sintering with vapor vents according to one or more embodiments shown and described herein.

Once the negative mold 810 of the second mold set 800 is assembled with the first porous wick layer 510 as depicted in FIG. 17, filler particles (not shown) are introduced to form a sacrificial layer 562 (as shown in FIG. 18B) with the first porous wick layer 510 as described above. Then metal particles 566 are introduced with the sacrificial layer 562 where at least the tops 536 of the plurality of porous liquid supply posts 530 are exposed with the surface of the sacrificial layer 562. Referring to FIGS. 18A and 18B, a positive mold 820 of the second mold set 800 is brought into contact with the metal particles 566. The metal particles 566 are sintered with the first porous wick layer 510 and the sacrificial layer 562 in the example assembly of the second mold set 800 depicted FIG. 19. The resulting multi-layer porous wick structure 500 comprises a first porous wick layer 510 defining a base wick layer coupled to a second porous wick layer 520 defining a cap wick layer through the plurality of porous liquid supply posts 530 extending between and forming interstitial spaces between the base wick layer and cap wick layer of the multi-layer porous wick structure. In some embodiments, for example as depicted in FIG. 20, the second porous wick layer 520 lacks vapor vents. In some embodiments, the vapor vents may be formed by machining, for example, without limitation, with a laser cutting system. A suitable but non-limiting laser-cutting system is produced by Universal Laser and commercially available under the trademark PLS6MW Multi-Wavelength Laser Platform, and is capable of cutting feature sizes with a microscale lateral resolution (tens of microns). The resulting multi-layer porous wick structure coupled to a copper block 815 is depicted in FIG. 21. In some embodiments, the copper block 815 is replaced with a metal plate, which is optionally a copper plate, and in yet further embodiments, the multi-layer porous wick structure 500 is decoupled from the copper block 815 after sintering. The multi-layer porous wick structure 500 may further be assembled with components of a vapor chamber or the components of a vapor chamber may be formed along with the fabrication of the multi-layer porous wick structure 500.

A further method of fabricating the vapor vents into the second porous wick layer 520 to avoid the potentially damaging impacts of a laser machining process on the porous wick structure are depicted in FIGS. 22 to 25 and described herein. Additionally, FIGS. 22 to 25 depict the formation of a liquid supply wick 570 with the first porous wick layer 510 defining the base wick layer and the second porous wick layer 520 defining the cap wick layer in light forming the multi-layer porous wick structure form the base wick layer to the cap wick layer.

Figure 22:
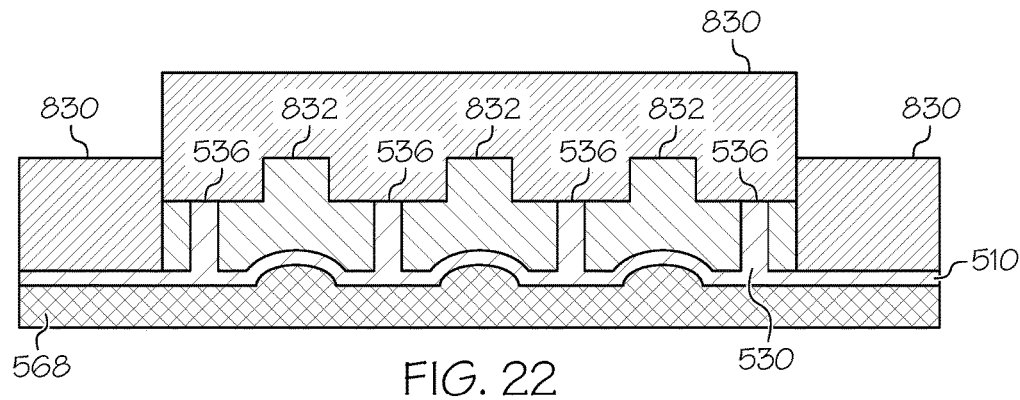
FIG. 22 schematically depicts a cross-sectional view of an example mold set assembly for forming a sacrificial layer with the first porous wick layer according to one or more embodiment shown and described herein.
Figure 23:
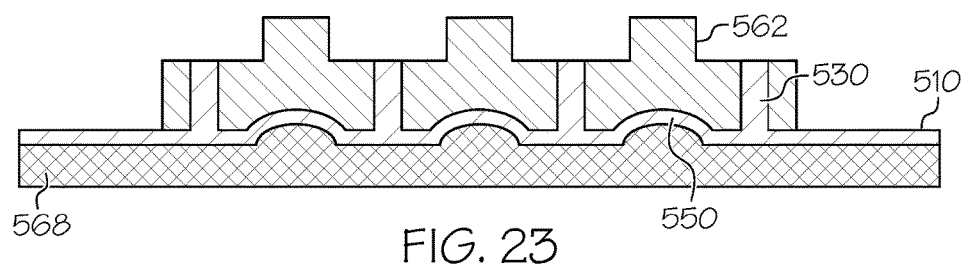
FIG. 23 schematically depicts a cross-sectional view of an example first porous wick layer having a sacrificial layer according to one or more embodiment shown and described herein.

Referring to FIG. 22, method of forming a sacrificial layer 562 with the first porous wick layer 510 depicted in FIG. 15 which was formed by sintering metal particles in the first mold set 600 assembly. In this embodiment, filler particles are compacted to form a sacrificial layer 562 with the plurality of porous liquid supply posts 530 of the first porous wick layer 510 with a forming mold 830 that is optionally assembled from multiple sections. The forming mold 830 provides the cavities 832 for receiving filler particles to fabricate a sacrificial layer 562 that extends above the plurality of porous liquid supply posts 530 in defined sections while maintaining exposure to at least the tops 536 of the plurality of porous liquid supply posts 530 for coupling to the metal particles 566 when forming the second porous wick layer 520. FIG. 23 depicts the resulting sacrificial layer 562 formed with the first porous wick layer 510.

As depicted, the first porous wick layer 510 is also coupled to a copper plate 568 defining an evaporator plate of a vapor chamber.

Figure 24:
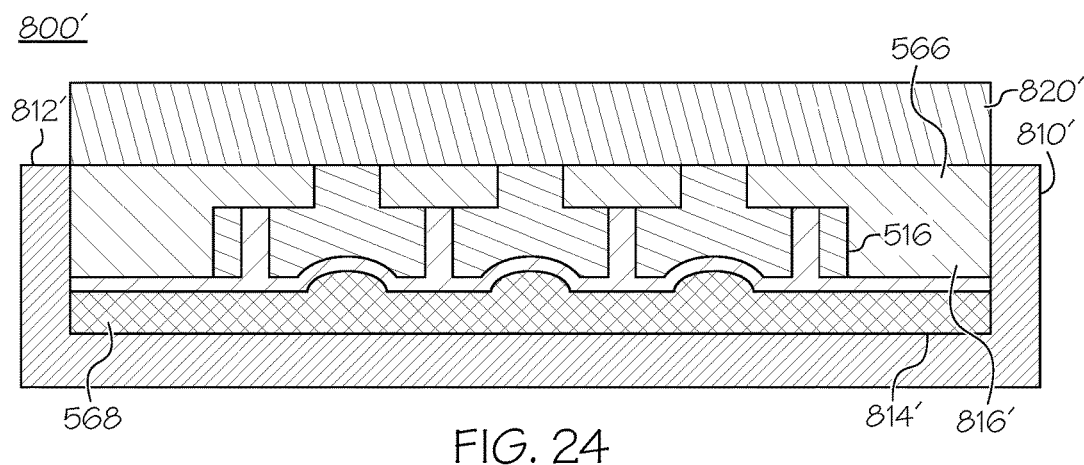
FIG. 24 schematically depicts a cross-sectional view of an example mold assembly for forming a liquid supply wick and a second porous wick layer with the first porous wick layer according to one or more embodiment shown and described herein.
Figure 25:
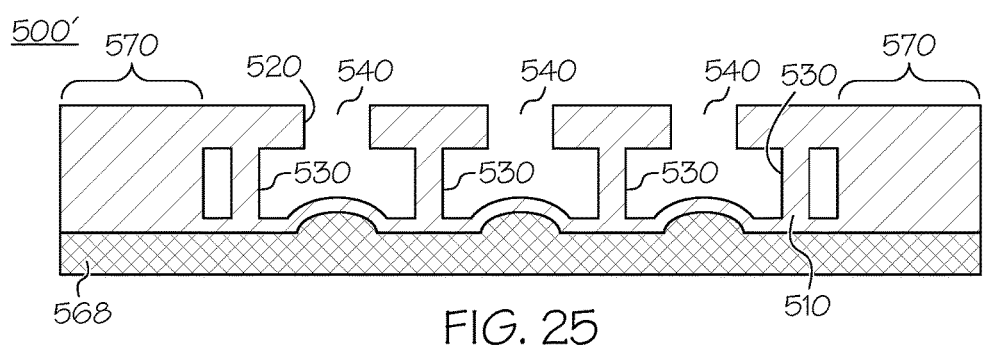
FIG. 25 schematically depicts a cross-sectional view of an example multi-layer wick structure having a liquid supply wick according to one or more embodiment shown and described herein.

The first porous wick layer 510 including the sacrificial layer 562 may then be configured with a negative mold 810' of a third mold set 800'. The negative mold 810' comprises a cavity defined by a base surface 814' offset from a negative mold top surface 812' enclosed by one or more sidewalls 816' extending around a perimeter of the base surface 814' and between the base surface 814' and the negative mold top surface 812'. The increased cavity size of the negative mold 810' includes space between the one or more sidewalls 516 of the first porous wick layer 510 and the one or more sidewalls 816' of the negative mold 810' extending around a perimeter of the base surface 814'. Metal particles 566 are introduced within this space and a corresponding positive mold 820' is interfaced with the negative mold 810', as shown in FIG. 24. A positive mold 820' contacts the metal particles 566 and the third mold set 800' assembly is sintered. FIG. 25 depicts the resulting multi-layer porous wick structure 500'. The multi-layer porous wick structure comprises a first porous wick layer 510 defining the base wick layer, the second porous wick layer 520 defining the cap wick layer, a plurality of porous liquid supply posts 530, a plurality of through-holes 540 defining vapor vents within the cap wick layer and a liquid supply wick 570 coupled to the cap wick layer and the base wick layer.

Figure 26:
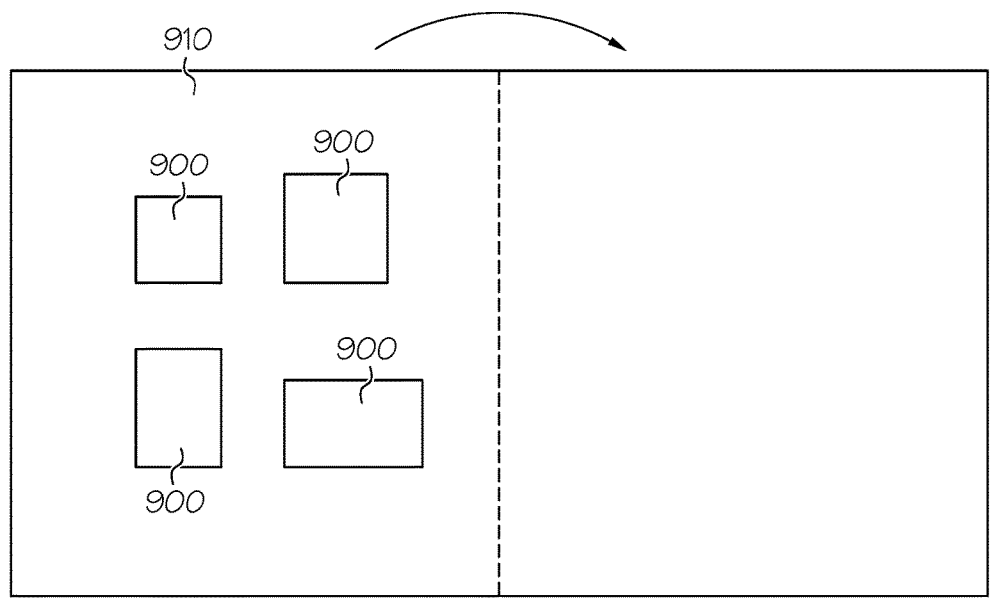
FIG. 26 schematically depicts a perspective view of an example vapor chamber with an array of multi-layer porous wick structures according to one or more embodiment shown and described herein.
Figure 27:
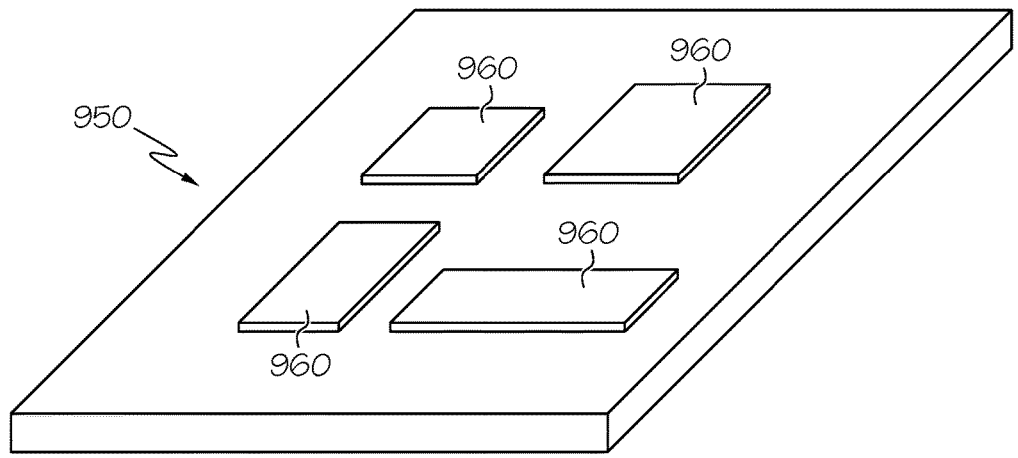
FIG. 27 schematically depicts a perspective view of an example vapor chamber attached to heat generating devices according to one or more embodiment shown and described herein.

Referring to FIGS. 26 and 27, in some embodiments, the mold sets and mold assemblies may be configured to form an array of multi-layer porous wick structures 900 on a thermally conductive sheet 910. The thermally conductive sheet 910 may include a bulk porous wick layer over it surface, which is interconnected with the array of multi-layer porous wick structures 900. The thermally conducive sheet 910 may be fold and crimped or welded thereby sealing and forming a vapor chamber. FIG. 27 depicts a complete vapor chamber 950 with heat generating devices 960 coupled to locations corresponding to the array of multi-layer porous wick structures 900 within the sealed vapor chamber 950.

It should now be understood that embodiments described herein are directed to methods of fabricating multi-layer porous wick structures with surface enhancement features. Methods of fabricating multi-layer porous wick structures herein comprise providing a first mold set comprising a negative mold and a positive mold, introducing metal particles into the negative mold of the first mold set, sintering the metal particles in the negative mold of the first mold set where pressure is applied to the metal particles with the positive mold of the first mold set thereby forming a first porous wick structure having a plurality of porous liquid supply posts. The method further generally include providing a second mold set comprising a negative mold configured to receive the first porous wick structure and a positive mold, introducing particles to form a sacrificial layer with the first porous wick structure in the negative mold of the second mold set, introducing metal particles with the sacrificial layer and the first wick structure in the negative mold of the second mold set and sintering the metal particles in the negative mold of the second mold set where pressure is applied to the metal particles by the positive mold of the second mold set. The sintering of the metal particles in the negative mold of the second mold set form a second porous wick layer coupled to the porous liquid supply posts of the first porous wick layer. The aforementioned general fabrication method may be further defined to accommodate variations in fabricating a multi-layer porous wick structure from a base wick layer to a cap wick layer or a cap wick layer to a base wick layer. Additionally, fabrication methods may include molds for forming vapor vents in the cap wick layer or liquid supply wicks coupling the base wick layer and the cap wick layer or surface enhancement features.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of fabricating a multi-layer porous wick structure, the method comprising:
    providing a first mold set comprising a negative mold and a positive mold;
    introducing meta particles in a cavity of the negative mold defining a first porous wick layer;
    sintering the metal particles at a first sintering temperature for a first sintering time within the negative mold while interfaced with the positive mold to form the first porous wick layer, wherein the first porous wick layer comprises a first surface opposite a second surface and a plurality of porous liquid supply posts extend from the first surface away from the second surface;
    providing a second mold set comprising a negative mold of the second mold set and a positive mold of the second mold set corresponding to the negative mold of the second mold set, wherein the negative mold of the second mold set comprises a cavity of the second mold set defined by one or more sidewalls enclosing a base surface offset from a negative mold top surface and the cavity of the negative mold of the second mold set is contoured for receiving the first porous wick layer;
    assembling the first porous wick layer with the negative mold of the second mold set;
    introducing filler particles into the negative mold of the second mold set, wherein the filler particles form a sacrificial layer with the first surface and the plurality of porous liquid supply posts of the first porous wick layer such that a portion of the plurality of porous liquid supply posts remain free of the sacrificial layer;
    introducing meta particles in the negative mold of the second mold set with the first porous wick layer and the sacrificial layer; and
    sintering the metal particles at a second sintering temperature for a second sintering time thereby forming the multi-layer porous wick structure comprising the first porous wick layer comprising the plurality of porous liquid supply posts coupled to a second porous wick layer.

2. The method of claim 1, wherein the negative mold of the first mold set comprises:
    one or more sidewalls extending around a perimeter of a second face of the negative mold of the first mold set and between a first face of the negative mold of the first mold set and the second face such that the second face and the one or more sidewalls form the cavity in the first face; and
    a plurality of holes extending from the second face away from the first face, and the positive mold of the first mold set comprises:
    a contact surface; and
    one or more sides extending around a perimeter of the contact surface that is selectively interfaced with the cavity of the negative mold of the first mold set.

3. The method of claim 2, wherein the negative mold of the first mold set further comprises a plurality of posts extending from the second face toward the first face.

4. The method of claim 2, wherein the negative mold of the first mold set further comprises a plurality of dimples on the second face of the negative mold to form a plurality of surface enhancement features on the first porous wick layer.

5. The method of claim 2, wherein the contact surface of the positive mold of the first mold set comprises a plurality of positive features.

6. The method of claim 1, wherein the metal particles are copper particles.

7. The method of claim 1, wherein the filler particles are carbonate particles.

8. The method of claim 1, wherein the at least one of the first porous wick layer and the second porous wick layer comprises a plurality of through-holes defining vapor vents.

9. The method of claim 1 wherein at least one of the first porous wick layer and the second porous wick layer comprises a plurality of surface enhancement features.

10. The method of claim 1, wherein the first porous wick layer comprises:
    one or more sidewalls extending around a perimeter of the first porous wick layer between the first surface and the second surface;
    a plurality of surface enhancement features formed with the first surface of the first porous wick layer; and
    a plurality of porous liquid supply posts extending from the first surface of the first porous wick layer to a height defined by the plurality of holes in the negative mold of the first mold set.

11. The method of claim 1, further comprising compacting the filler particles with an intermediate positive mold, wherein the intermediate positive mold comprises a plurality of features on a compacting surface such that compacting the filler particles forms corresponding features in the sacrificial layer.

12. The method of claim 1, further comprising introducing a metal plate between the metal particles in the negative mold of the second mold set and the positive mold of the second mold set.

13. The method of claim 12, wherein the metal plate is a copper plate.

14. The method of claim 1, wherein the positive mold of the second mold set comprises a plurality of positive features such that applying pressure to the metal particles forms corresponding negative features in the second porous wick layer.

15. The method of claim 1, further comprising machining a plurality of through-holes in the second porous wick layer forming a plurality of vapor vents disposed within the second porous wick layer.

* * * * *